US011339329B2

(12) United States Patent
Hoshino et al.

(10) Patent No.: US 11,339,329 B2
(45) Date of Patent: *May 24, 2022

(54) POLARIZER AND IMAGE DISPLAY DEVICE

(71) Applicant: FUJIFILM Corporation, Tokyo (JP)

(72) Inventors: Wataru Hoshino, Kanagawa (JP); Yoshiaki Takada, Kanagawa (JP); Kengo Saito, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 35 days.

This patent is subject to a terminal disclaimer.

(21) Appl. No.: 16/907,822

(22) Filed: Jun. 22, 2020

(65) Prior Publication Data

US 2020/0318010 A1 Oct. 8, 2020

Related U.S. Application Data

(63) Continuation of application No. PCT/JP2018/048525, filed on Dec. 28, 2018.

(30) Foreign Application Priority Data

Dec. 28, 2017 (JP) .............................. JP2017-254551

(51) Int. Cl.
*C09K 19/46* (2006.01)
*C09K 19/60* (2006.01)
(Continued)

(52) U.S. Cl.
CPC ............ *C09K 19/46* (2013.01); *C09K 19/601* (2013.01); *G02B 5/3016* (2013.01); *G02F 1/133528* (2013.01); *H01L 51/5281* (2013.01)

(58) Field of Classification Search
CPC ...................................................... C09K 19/60
See application file for complete search history.

(56) References Cited

U.S. PATENT DOCUMENTS

2007/0007492 A1 1/2007 Takaku et al.
2009/0323012 A1 12/2009 He et al.
(Continued)

FOREIGN PATENT DOCUMENTS

CN 102076820 A 5/2011
JP 11-101964 A 4/1999
(Continued)

OTHER PUBLICATIONS

Office Action, issued by the Japanese Patent Office dated Jun. 2, 2020, in connection with Japanese Patent Application No. 2019-562515.
(Continued)

*Primary Examiner* — Chanceity N Robinson
(74) *Attorney, Agent, or Firm* — Edwards Neils LLC; Jean C. Edwards, Esq.

(57) ABSTRACT

Provided is a polarizer having a high degree of alignment and an image display device including the polarizer. The polarizer is formed of a polarizer-forming composition containing a polymer liquid crystal compound and a dichroic material, in which the polymer liquid crystal compound is a thermotropic liquid crystal and a crystalline polymer, the polymer liquid crystal compound and the dichroic material are horizontally aligned, and crystallinity of the polymer liquid crystal compound in the polarizer-forming composition is higher than the crystallinity of the polymer liquid crystal compound alone.

20 Claims, 1 Drawing Sheet

(51) Int. Cl.
*G02B 5/30* (2006.01)
*G02F 1/1335* (2006.01)
*H01L 51/52* (2006.01)

(56) References Cited

U.S. PATENT DOCUMENTS

| | | |
|---|---|---|
| 2010/0267858 A1 | 10/2010 | Lub et al. |
| 2017/0240810 A1* | 8/2017 | Hida .................... C09B 31/043 |
| 2018/0067348 A1 | 3/2018 | Hatanaka |
| 2018/0346633 A1 | 12/2018 | Hoshino et al. |
| 2019/0101676 A1 | 4/2019 | Katou et al. |

FOREIGN PATENT DOCUMENTS

| | | |
|---|---|---|
| JP | 11-326638 A | 11/1999 |
| JP | 2001-271069 A | 10/2001 |
| JP | 2002-011951 A | 1/2002 |
| JP | 2002-207118 A | 7/2002 |
| JP | 2007-009120 A | 1/2007 |
| JP | 2011-526321 A | 10/2011 |
| JP | 2011-237513 A | 11/2011 |
| JP | 2013-217964 A | 10/2013 |
| KR | 10-2017-0127013 A | 11/2017 |
| WO | 2016/060174 A1 | 4/2016 |
| WO | 2017/154907 A1 | 9/2017 |
| WO | 2017/170036 A1 | 10/2017 |

OTHER PUBLICATIONS

International Search Report issued in PCT/JP2018/048525 dated Mar. 5, 2019.
Written Opinion issued in PCT/JP2018/048525 dated Mar. 5, 2019.
International Preliminary Report on Patentability completed by WIPO on Jun. 30, 2020 in connection with International Patent Application No. PCT/JP2018/048525.
Office Action, issued by the State Intellectual Property Office dated Jan. 17, 2022, in connection with Korean Patent Application No. 10-2020-7018210.
Office Action issued by the State Intellectual Property Office of the People's Republic of China dated Oct. 11, 2021 in connection with Chinese Patent Application No. 201880083700.8.

* cited by examiner

POLARIZER AND IMAGE DISPLAY DEVICE

CROSS-REFERENCE TO RELATED APPLICATIONS

This application is a Continuation of PCT International Application No. PCT/JP2018/048525 filed on Dec. 28, 2018, which was published under PCT Article 21(2) in Japanese, and which claims priority under 35 U.S.C. § 119(a) to Japanese Patent Application No. 2017-254551 filed on Dec. 28, 2017. The above applications are hereby expressly incorporated by reference, in their entirety, into the present application.

BACKGROUND OF THE INVENTION

1. Field of the Invention

The present invention relates to a polarizer and an image display device.

2. Description of the Related Art

In the related art, in a case where an attenuation function, a polarization function, a scattering function, a light shielding function of irradiation light including laser light or natural light is required, a device that is operated according to principles different for each function is used. Therefore, products corresponding to the above-described functions are also produced by production processes different for each function.

For example, a linear polarizer or a circular polarizer is used in an image display device (for example, a liquid crystal display device) to control optical rotation or birefringence in display. Further, a circular polarizer is used in an organic light emitting diode (OLED) to prevent reflection of external light.

In the related art, iodine has been widely used as a dichroic material in these polarizers, but a polarizer that uses an organic coloring agent in place of iodine as a dichroic material has also been examined.

For example, WO2017/154907A discloses a polarizer-forming composition which contains a polymer liquid crystal compound and a dichroic material.

SUMMARY OF THE INVENTION

As a result of preparation of a polarizer with reference to the examples of WO2017/154907A and evaluation of the degree of alignment thereof which are conducted by the present inventors under the above-described circumstance, it was clarified that further improvement of the degree of alignment is desirable in consideration of improvement of the performance of an image display device or the like expected in the future.

Further, in consideration of the above-described circumstances, an object of the present invention is to provide a polarizer with a high degree of alignment and an image display device including the polarizer.

As a result of intensive examination conducted by the present inventors in order to solve the above-described problems, it was found that (i) the degree of alignment is improved by using a crystalline polymer as a polymer liquid crystal compound, (ii) the phenomenon of (i) occurs specifically in a case where a polymer liquid crystal compound and a dichroic material are horizontally aligned, and (iii) the degree of alignment is improved in a case where the crystallinity of the polymer liquid crystal compound in a polarizer-forming composition is higher than the crystallinity of the polymer liquid crystal compound alone, thereby completing the present invention.

That is, the present inventors found that the above-described problems can be solved by employing the following configurations.

(1) A polarizer which is formed of a polarizer-forming composition containing a polymer liquid crystal compound and a dichroic material, in which the polymer liquid crystal compound is a thermotropic liquid crystal and a crystalline polymer, the polymer liquid crystal compound and the dichroic material are horizontally aligned, and a crystallinity of the polymer liquid crystal compound in the polarizer-forming composition is higher than a crystallinity of the polymer liquid crystal compound alone.

(2) The polarizer according to (1), in which the polymer liquid crystal compound has a planar structure P and the dichroic material has a planar structure Q, and a ratio R of a length q of the planar structure Q to a length p of the planar structure P is in a range of 0.91 to 1.50, where the ratio R represents any of the following (i) to (iii).

(i) q/p
(ii) 2q/p
(iii) q/2p

In (i) to (iii), p represents the length p, and q represents the length q.

(3) The polarizer according to (2), in which the ratio R is 1.15 or less.

(4) The polarizer according to (2) or (3), in which the ratio R is 0.95 or greater.

(5) The polarizer according to any one of (1) to (4), in which a difference between a log P value of the polymer liquid crystal compound and a log P value of the dichroic material is 7.0 or less.

(6) The polarizer according to (5), in which the difference between a log P value of the polymer liquid crystal compound and a log P value of the dichroic material is 6.0 or less.

(7) The polarizer according to any one of (1) to (6), in which the polymer liquid crystal compound has a repeating unit represented by Formula (1).

(8) The polarizer according to (7), in which the mesogen group represented by M1 in Formula (1) has three aromatic hydrocarbon groups.

(9) The polarizer according to (7) or (8), in which the spacer group represented by SP1 in Formula (1) is a group represented by *—$(CH_2$—$CH_2O)_3$—*, where a symbol * represents a bonding position with respect to L1 or M1 in Formula (1).

(10) The polarizer according to any one of (7) to (9), in which the terminal group represented by T1 in Formula (1) is a methoxy group.

(11) The polarizer according to any one of (7) to (10), in which the polymer liquid crystal compound has two kinds of repeating units represented by Formula (1), in one repeating unit, T1 in Formula (1) represents an alkoxy group, and in the other repeating unit, T1 in Formula (1) represents a group other than the alkoxy group.

(12) An image display device comprising: the polarizer according to any one of (1) to (11).

As described below, according to the present invention, it is possible to provide a polarizer with a high degree of alignment and an image display device including the polarizer.

DESCRIPTION OF THE PREFERRED EMBODIMENTS

Figure 1:
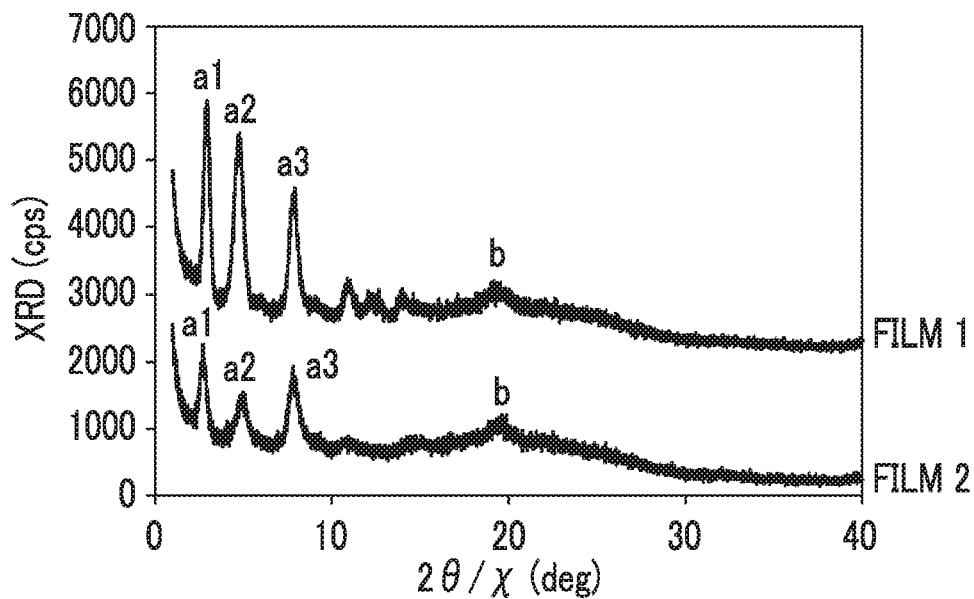
FIG. 1 shows comparison between an XRD spectrum of a polarizer according to one embodiment of the present invention using a polymer liquid crystal compound L1 and an XRD spectrum of a film of the polymer liquid crystal compound L1 alone.

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Respective components may be used alone or in combination of two or more kinds thereof. Here, in a case where two or more kinds of respective components are used in combination, the content of the components indicates the total content unless otherwise specified.

Further, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[Polarizer]

The polarizer of the present invention is a polarizer which is formed of a polarizer-forming composition containing a polymer liquid crystal compound and a dichroic material, in which the polymer liquid crystal compound is a thermotropic liquid crystal and a crystalline polymer, the polymer liquid crystal compound and the dichroic material are horizontally aligned, and crystallinity of the polymer liquid crystal compound in the polarizer-forming composition is higher than the crystallinity of the polymer liquid crystal compound alone.

Since the polarizer according to the embodiment of the present invention has such a configuration, a high degree of alignment is considered to be exhibited.

As described above, a phenomenon in which the degree of alignment is improved in a case where a crystalline polymer is used as the polymer liquid crystal compound is a phenomenon occurring specifically in a case where the polymer liquid crystal compound and the dichroic material are horizontally aligned.

[Polarizer-Forming Composition]

The polarizer-forming composition used in the polarizer according to the embodiment of the present invention (hereinafter, also referred to as "the composition of the present invention") contains a polymer liquid crystal compound and a dichroic material. Here, the polymer liquid crystal compound is a thermotropic liquid crystal and a crystalline polymer at the same time.

The composition of the present invention may contain components other than the polymer liquid crystal compound and the dichroic material.

Hereinafter, each component will be described.

<Polymer Liquid Crystal Compound>

As described above, the composition of the present invention contains a polymer liquid crystal compound (hereinafter, also referred to as "specific compound") which is a thermotropic liquid crystal and a crystalline polymer.

(Thermotropic Liquid Crystal)

A thermotropic liquid crystal is a liquid crystal that shows transition to a liquid crystal phase due to a change in temperature.

The specific compound is a thermotropic liquid crystal and may exhibit any of a nematic phase and a smectic phase, but it is preferable that the specific compound exhibits at least the nematic phase from the viewpoint that the effects of the present invention become more excellent.

The temperature at which the nematic phase is exhibited is preferably in a range of room temperature (23° C.) to 450° C. from the viewpoint that the effects of the present invention become more excellent, and more preferably in a range of 50° C. to 400° C. from the viewpoint of handleability and manufacturing suitability.

(Crystalline Polymer)

A crystalline polymer is a polymer showing a transition to a crystal layer due to a change in temperature. The crystalline polymer may show a glass transition other than the transition to the crystal layer.

From the viewpoint that the effects of the present invention become more excellent, it is preferable that the specific compound is a polymer liquid crystal compound that shows a transition (may show a glass transition during the process) from a crystal phase to a liquid crystal phase in a case of being heated or a polymer liquid crystal compound that shows a transition (may show a glass transition during the process) to a crystal phase in a case of being heated to enter a liquid crystal state and then being cooled down.

The presence or absence of crystallinity of the polymer liquid crystal compound is evaluated as follows.

Two polarizers of an optical microscope (ECLIPSE E600 POL, manufactured by Nikon Corporation) are disposed so as to be orthogonal to each other, and a sample table is set between the two polarizers. Further, a small amount of the polymer liquid crystal compound is placed on slide glass, and the slide glass is set on a hot stage placed on the sample table. While the state of the sample is observed, the temperature of the hot stage is increased to a temperature at which the polymer liquid crystal compound exhibits liquid crystallinity, and the polymer liquid crystal compound is allowed to enter a liquid crystal state. After the polymer liquid crystal compound enters the liquid crystal state, the behavior of the liquid crystal phase transition is observed while the temperature of the hot stage is gradually lowered, and the temperature of the liquid crystal phase transition is recorded. In a case where the polymer liquid crystal compound exhibits a plurality of liquid crystal phases (for example, a nematic phase and a smectic phase), all the transition temperatures are also recorded.

Next, approximately 5 mg of a sample of the polymer liquid crystal compound is put into an aluminum pan, and the pan is covered and set on a differential scanning calorimeter (DSC) (an empty aluminum pan is used as a reference). The polymer liquid crystal compound measured in the above-described manner is heated to a temperature at which the compound exhibits a liquid crystal phase, and the temperature is maintained for 1 minute. Thereafter, the calorific value is measured while the temperature is lowered at a rate of 10° C./min. An exothermic peak is confirmed from the obtained calorific value spectrum.

As a result, in a case where an exothermic peak is observed at a temperature other than the liquid crystal phase transition temperature, it can be said that the exothermic peak is a peak due to crystallization and the polymer liquid crystal compound has crystallinity.

Meanwhile, in a case where an exothermic peak is observed at a temperature other than the liquid crystal phase transition temperature, it can be said that the polymer liquid crystal compound does not have crystallinity.

The method of obtaining a crystalline polymer is not particularly limited, but as a specific example, a method of using a polymer liquid crystal compound that contains a repeating unit (1) described below is preferable, and a method of using a suitable form among polymer liquid crystal compounds having a repeating unit (1) described below is more preferable.

(Crystallization Temperature)

As described above, the specific compound is a crystallized polymer.

From the viewpoint that the effects of the present invention become more excellent, the crystallization temperature of the specific compound is preferably 0° C. or higher and lower than 150° C., more preferably 120° C. or lower, still more preferably 15° C. or higher and lower than 120° C., and particularly preferably 95° C. or lower. The crystallization temperature of the polymer liquid crystal compound is preferably lower than 150° C. from the viewpoint of reducing haze.

Further, the crystallization temperature is a temperature of an exothermic peak due to crystallization in the above-described DSC.

(Suitable Form)

From the viewpoint that the effects of the present invention become more excellent, it is preferable that the specific compound is a polymer liquid crystal compound having a repeating unit represented by Formula (1) (hereinafter, also referred to as a "repeating unit (1)").

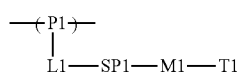

(1)

In Formula (1), P1 represents a main chain of the repeating unit, L represents a single bond or a divalent linking group, SP1 represents a spacer group, M represents a mesogen group, and T1 represents a terminal group.

Specific examples of the main chain of the repeating unit represented by P1 include groups represented by Formulae (P1-A) to (P1-D). Among these, from the viewpoints of diversity and handleability of a monomer serving as a raw material, a group represented by Formula (P1-A) is preferable.

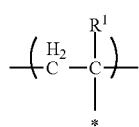

(P1-A)

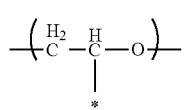

(P1-B)

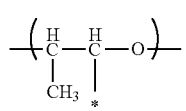

(P1-C)

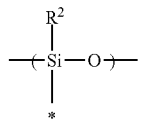

(P1-D)

In Formulae (P1-A) to (P1-D), the symbol "*" represents a bonding position with respect to L1 in Formula (1). In Formula (P1-A), $R^1$ represents a hydrogen atom or a methyl group. In Formula (P1-D), $R^2$ represents an alkyl group.

From the viewpoint that the effects of the present invention become more excellent, it is preferable that the group represented by Formula (P1-A) is a unit of a partial structure of poly(meth)acrylic acid ester obtained by polymerization of (meth)acrylic acid ester.

From the viewpoint that the effects of the present invention become more excellent, it is preferable that the group represented by Formula (P1-B) is an ethylene glycol unit in polyethylene glycol obtained by polymerizing ethylene glycol.

From the viewpoint that the effects of the present invention become more excellent, it is preferable that the group represented by Formula (P1-C) is a propylene glycol unit obtained by polymerizing propylene glycol.

From the viewpoint that the effects of the present invention become more excellent, it is preferable that the group represented by Formula (P1-D) is preferably a siloxane unit of a polysiloxane obtained by polycondensation of a silanol.

L1 represents a single bond or a divalent linking group.

Examples of the divalent linking group represented by L include —C(O)O—, —OC(O)—, —O—, —S—, —C(O)NR³—, —NR³C(O)—, —SO₂— and —NR³R⁴—. In the formulae, $R^3$ and $R^4$ each independently represent a hydrogen atom or an alkyl group having 1 to 6 carbon atoms which may have a substituent (for example, a substituent W described below).

In a case where P1 represents a group represented by Formula (P1-A), from the viewpoint that the effects of the present invention become more excellent, it is preferable that L1 represents a group represented by —C(O)O—.

In a case where P represents a group represented by any of Formulae (P1-B) to (P1-D), from the viewpoint that the effects of the present invention become more excellent, it is preferable that L1 represents a single bond.

From the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—(CH₂—CH₂O)$_{n1}$—* is preferable. In the formula, n1 represents an integer of 1 to 20, and the symbol "*" represents a bonding position with respect to L1 or M1 in Formula (1). From the viewpoint that the effects of the present invention become more excellent, n1 represents preferably an integer of 2 to 10, more preferably an integer of 2 to 4, and most preferably 3.

Further, from the viewpoint that the effects of the present invention become more excellent, a group represented by *—(CH(CH₃)—CH₂O)$_{n2}$—* is preferable as the oxypropylene structure represented by SP1. In the formula, n2 represents an integer of 1 to 3, and the symbol "*" represents a bonding position with respect to L1 or M1.

Further, from the viewpoint that the effects of the present invention become more excellent, a group represented by *—(Si(CH$_3$)$_2$—O)$_{n3}$—* is preferable as the polysiloxane structure represented by SP1. In the formula, n3 represents an integer of 6 to 10, and the symbol "*" represents a bonding position with respect to L1 or M1.

Further, from the viewpoint that the effects of the present invention become more excellent, a group represented by *—(CF$_2$—CF$_2$)$_{n4}$—* is preferable as the alkylene fluoride structure represented by SP1. In the formula, n4 represents an integer of 6 to 10, and the symbol "*" represents a bonding position with respect to L1 or M1.

The mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and can refer to, for example, description on pages 7 to 16 of "FlussigeKristalle in Tabellen II" (VEB Deutsche Verlag fur Grundstoff Industrie, Leipzig, 1984) and the description in Chapter 3 of "Liquid Crystal Handbook" (Maruzen, 2000) edited by Liquid Crystals Handbook Editing Committee.

As the mesogen group, for example, a group having at least one cyclic structure selected from the group consisting of an aromatic hydrocarbon group, a heterocyclic group, and an alicyclic group is preferable.

From the viewpoint that the effects of the present invention become more excellent, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability and from the viewpoint that the effects of the present invention become more excellent, as the mesogen group, a group represented by Formula (M1-A) or Formula (M1-B) is preferable, and a group represented by Formula (M1-B) is more preferable.

  (M1-A)

  (M1-B)

In Formula (M1-A), A1 represents a divalent group selected from the group consisting of an aromatic hydrocarbon group, a heterocyclic group, and an alicyclic group. These groups may be substituted with a substituent such as an alkyl group, a fluorinated alkyl group, an alkoxy group, or a substituent W described below.

The divalent group represented by A1 is preferably a 4- to 6-membered ring. Further, the divalent group represented by A1 may be a single ring or a fused ring.

The symbol "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the degree of alignment.

The atoms other than carbon constituting the divalent aromatic heterocyclic group include a nitrogen atom, a sulfur atom and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene (thiophene-diyl group), a quinolylene group (quinoline-diyl group), an isoquinolylene group (isoquinolin-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the effects of the present invention become more excellent, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint that the effects of the present invention become more excellent, it is preferable that one of the two LA1's represents a divalent linking group and the other represents a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)—C(Z')—C(O)—, —S—C(O)—C(Z)=C(Z')—, —C(Z)—N—N=C(Z')—(Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among these, from the viewpoint that the effects of the present invention become more excellent, —C(O)O— is preferable. LA1 may represent a group obtained by combining two or more of these groups.

Specific examples of M1 include the following structures. In the following specific examples, "Ac" represents an acetyl group.

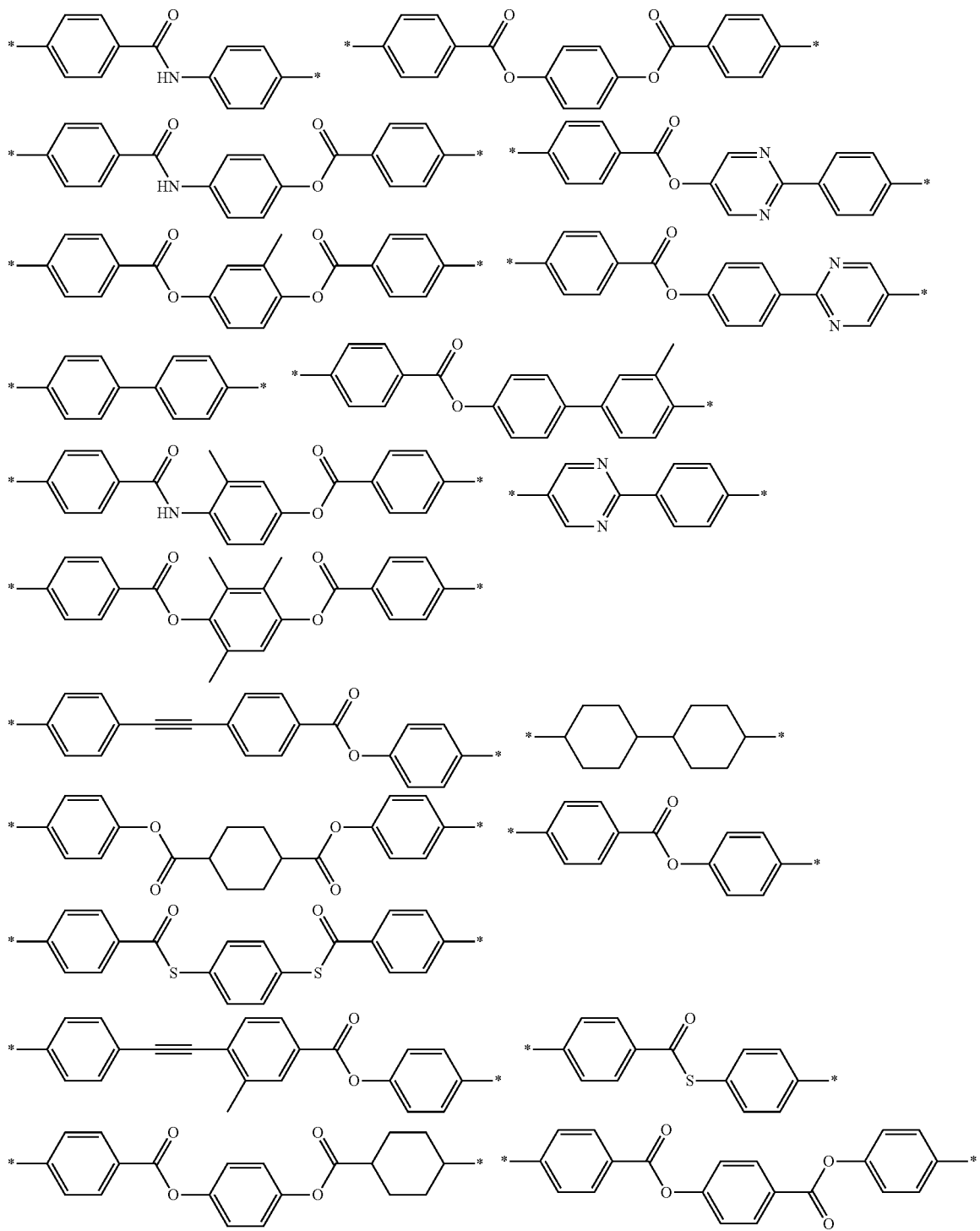

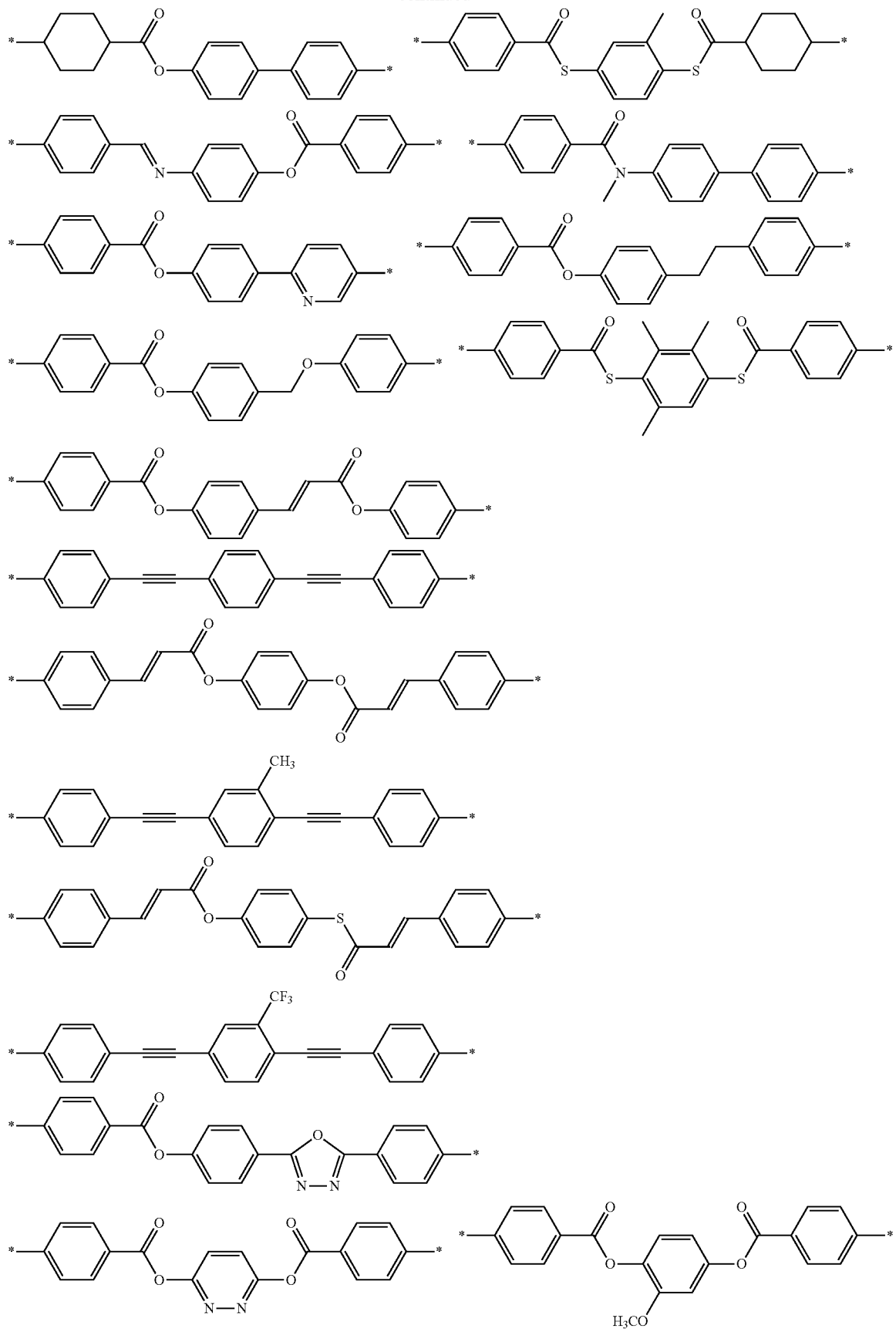

-continued
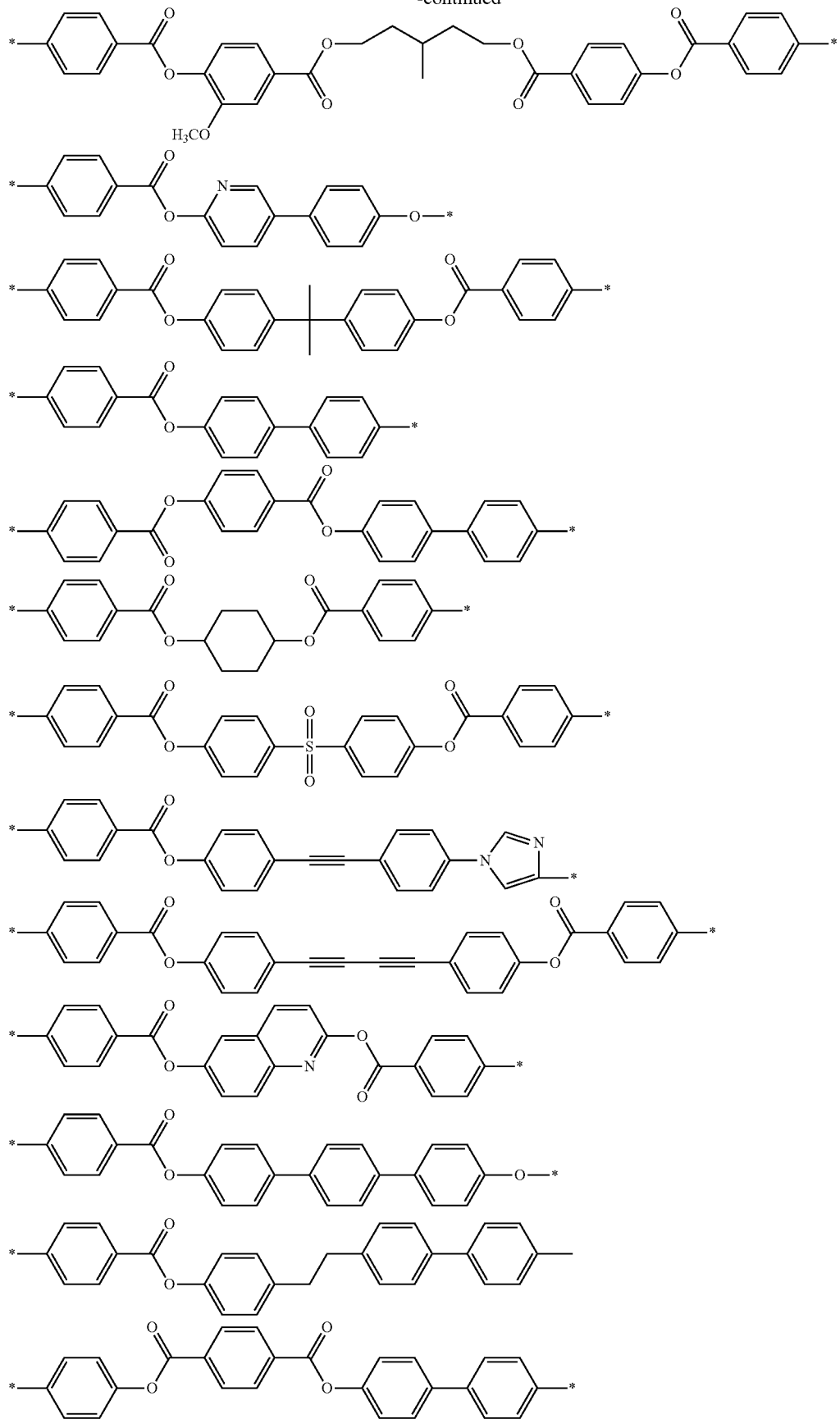

-continued
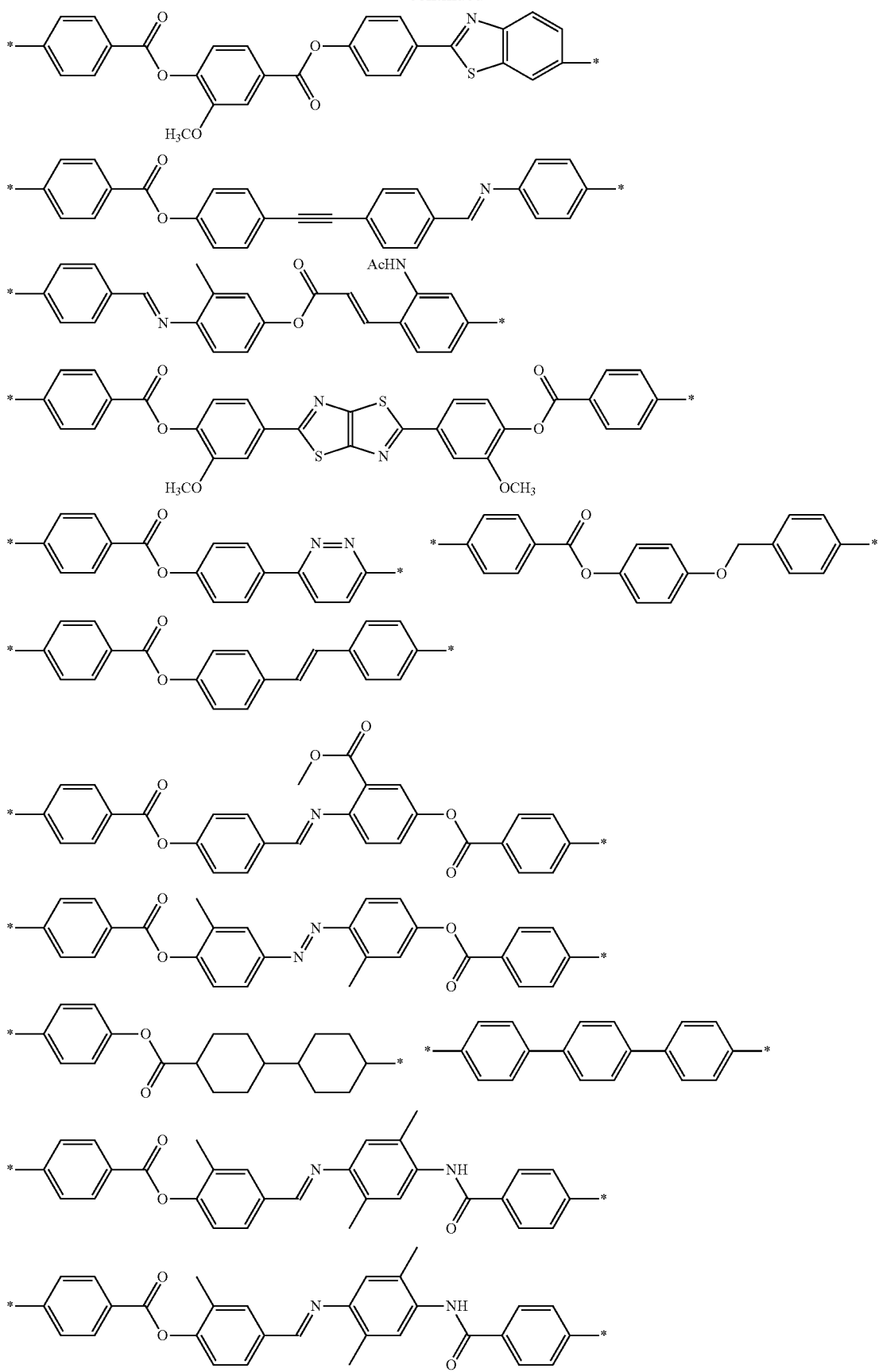

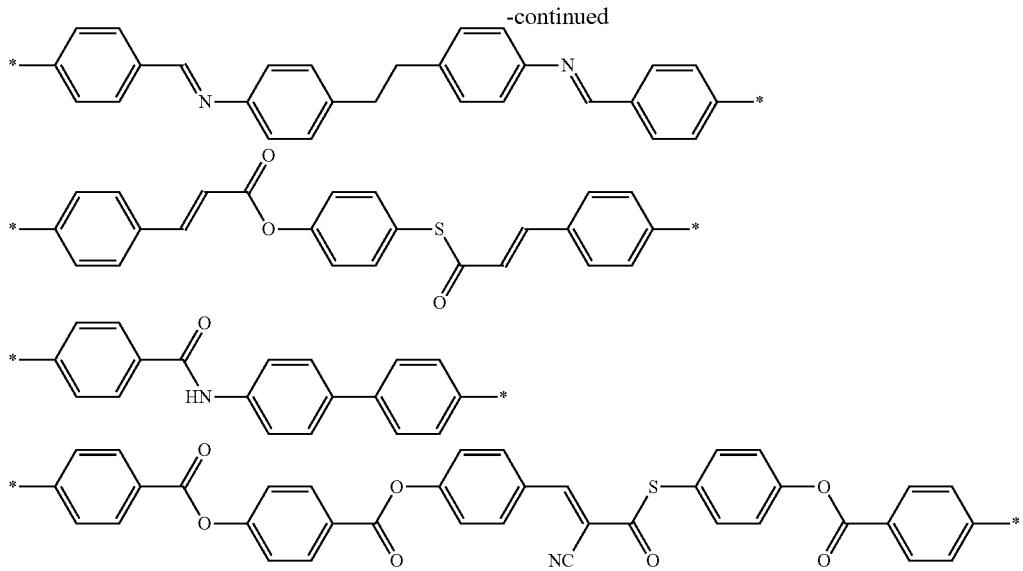

Examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio a group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group. Specific examples of the linking group are the same as those for L1 and SP1 described above, and A represents a (meth)acryloyloxy group).

From the viewpoint that the effects of the present invention become more excellent, T1 represents preferably an alkoxy group having 1 to 10 carbon atoms, more preferably an alkoxy group having 1 to 5 carbon atoms, and still more preferably a methoxy group. These terminal groups may be further substituted with these groups or the polymerizable groups described in JP2010-244038A.

From the viewpoint that the effects of the present invention become more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the degree of alignment of the polarizer is further improved. Here, the "main chain" in T1 indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

From the viewpoint that the effects of the present invention become more excellent, the content of the repeating unit (1) is preferably in a range of 20% to 100% by mass, more preferably in a range of 30% to 99.9% by mass, and still more preferably in a range of 40% to 99.0% by mass with respect to 100% by mass of all the repeating units in the specific compound.

In the present invention, the content of each repeating unit contained in the polymer liquid crystal compound is calculated based on the charged amount (mass) of each monomer used for obtaining each repeating unit.

The specific compound may have only one or two or more kinds of the repeating units (1). Among these, from the viewpoint that the effects of the present invention become more excellent, the specific compound may have two kinds of the repeating units (1).

In a case where the specific compound has two kinds of the repeating units (1), from the viewpoint that the effects of the present invention become more excellent, it is preferable that the terminal group represented by T1 in one (repeating unit A) is an alkoxy group and the terminal group represented by T1 in the other (repeating unit B) is a group other than the alkoxy group.

From the viewpoint that the effects of the present invention become more excellent, as the terminal group represented by T1 in the repeating unit B, an alkoxycarbonyl group, a cyano group, or a (meth)acryloyloxy group-containing group is preferable, and an alkoxycarbonyl group or a cyano group is more preferable.

From the viewpoint that the effects of the present invention become more excellent, the ratio (A/B) between the content of the repeating unit A in the specific compound and the content of the repeating unit B in the specific compound is preferably in a range of 50/50 to 95/5, more preferably in a range of 60/40 to 93/7, and still more preferably in a range of 70/30 to 90/10.

(Weight-Average Molecular Weight)

From the viewpoint that the effects of the present invention become more excellent, the weight-average molecular weight (Mw) of the specific compound is preferably in a range of 1000 to 500000 and more preferably in a range of 2000 to 300000. In a case where the Mw of the specific compound is in the above-described range, the specific compound is easily handled.

In particular, from the viewpoint of suppressing cracking during the coating, the weight-average molecular weight (Mw) of the specific compound is preferably 10000 or greater and more preferably in a range of 10000 to 300,000.

In addition, from the viewpoint of the temperature latitude of the degree of alignment, the weight-average molecular weight (Mw) of the specific compound is preferably less than 10000 and more preferably 2000 or greater and less than 10000.

Here, the weight-average molecular weight and the number average molecular weight in the present invention are values measured according to gel permeation chromatography (GPC).

Solvent (eluent): N-methylpyrrolidone
Equipment name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2800000 to 1050 (Mw/Mn=1.03 to 1.06) are used.

<Dichroic Material>

The dichroic material is not particularly limited, and examples thereof include a visible light absorbing material (dichroic coloring agent), a luminescent material (such as a fluorescent material or a phosphorescent material), an ultraviolet absorbing material, an infrared absorbing material, a nonlinear optical material, a carbon nanotube, and an inorganic material (for example, a quantum rod). Further, known dichroic materials (dichroic coloring agents) of the related art can be used.

Specific examples thereof include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-014883A, paragraphs [0012] to [0029] of JP2013-109090A, paragraphs [0009] to [0017] of JP2013-101328A, paragraphs [0051] to [0065] of JP2013-037353A, paragraphs [0049] to [0073] of JP2012-063387A, paragraphs [0016] to [0018] of JP1999-305036A (JP-H11-305036), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0005] to [0041] of WO 2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, and paragraphs [0014] to [0034] of WO2018/164252A.

In the present invention, two or more kinds of dichroic materials may be used in combination. For example, from the viewpoint of making the color of the polarizer closer to black, it is preferable that at least one dichroic material having a maximum absorption wavelength in a wavelength range of 370 to 550 nm and at least one dichroic material having a maximum absorption wavelength in a wavelength range of 500 to 700 nm are used in combination.

From the viewpoint that the effects of the present invention become more excellent, it is preferable that the dichroic material contains a crosslinkable group.

Specific examples of the crosslinkable group include a (meth)acryloyl group, an epoxy group, an oxetanyl group, and a styryl group. Among these, a (meth)acryloyl group is preferable.

In the composition of the present invention, from the viewpoint that the effects of the present invention become more excellent, the content of the dichroic material is preferably in a range of 1 to 400 parts by mass, more preferably in a range of 2 to 100 parts by mass, and still more preferably in a range of 5 to 30 parts by mass with respect to 100 parts by mass of the specific compound.

<Solvent>

From the viewpoint of workability and the like, it is preferable that the composition of the present invention contains a solvent.

Examples of the solvent include ketones (such as acetone, 2-butanone, methyl isobutyl ketone, cyclopentanone, and cyclohexanone), ethers (such as dioxane, tetrahydrofuran, and cyclopentyl methyl ether), aliphatics hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane (chloroform), dichloroethane, dichlorobenzene, and chlorotoluene), esters (such as methyl acetate, ethyl acetate, and butyl acetate), alcohols (such as ethanol, isopropanol, butanol, and cyclohexanol), cellosolves (such as methyl cellosolve, ethyl cellosolve, and 1,2-dimethoxyethane), cellosolve acetates, sulfoxides (such as dimethyl sulfoxide), amides (such as dimethylformamide and dimethylacetamide), organic solvents such as heterocyclic compounds (such as pyridine), and water. These solvents may be used alone or in combination of two or more kinds thereof.

Among these solvents, from the viewpoint that the effects of the present invention become more excellent, it is preferable to use an organic solvent and more preferable to use halogenated carbons or ketones.

In a case where the composition of the present invention contains a solvent, from the viewpoint that the effects of the present invention become more excellent, the content of the solvent is preferably in a range of 70% to 99.5% by mass, more preferably in a range of 80% to 99% by mass, and still more preferably in a range of 85% to 97% by mass with respect to the total mass of the composition of the present invention.

<Interface Modifier>

From the viewpoint that the effects of the present invention become more excellent, it is preferable that the composition of the present invention contains an interface modifier. In a case where the composition contains an interface modifier, the smoothness of the coated surface is improved, the degree of alignment is improved, and cissing and unevenness are suppressed so that the in-plane uniformity is expected to be improved.

As the interface modifier, interface modifiers that allow polymer liquid crystal compounds to be horizontally aligned are preferable, and compounds (horizontal alignment agents) described in paragraphs [0253] to [0293] of JP2011-237513A can be used. Further, fluorine (meth)acrylate-based polymers described in [0018] to [0043] of JP2007-272185A can also be used. Compounds other than the compounds described above may be used as the interface modifier.

In a case where the composition of the present invention contains an interface modifier, from the viewpoint that the effects of the present invention become more excellent, the content of the interface modifier is preferably in a range of 0.001 to 5 parts by mass and more preferably in a range of 0.01 to 3 parts by mass with respect to 100 parts by mass which is the total amount of the specific compound and the dichroic material in the composition.

<Polymerization Initiator>

From the viewpoint that the effects of the present invention become more excellent, it is preferable that the composition of the present invention contains a polymerization initiator. The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), and acylphosphine oxide compounds (JP1988-040799A (JP-S63-040799A), JP1993-029234A (JP-H05-029234A), JP1998-095788A (JP-H10-095788A), and JP1998-029997A (JP-H10-029997A)).

Commercially available products can also be used as such a photopolymerization initiator, and examples thereof include IRGACURE 184, IRGACURE 907, IRGACURE 369, IRGACURE 651, IRGACURE 819, and IRGACURE OXE-01 (all manufactured by BASF SE).

In a case where the composition of the present invention contains a polymerization initiator, from the viewpoint that the effects of the present invention become more excellent, the content of the polymerization initiator is preferably in a range of 0.01 to 30 parts by mass and more preferably in a range of 0.1 to 15 parts by mass with respect to 100 parts by mass which is the total amount of the specific compound and the dichroic material in the composition. The durability of the polarizer becomes excellent in a case where the content of the polymerization initiator is 0.01 parts by mass or greater, and the alignment of the polarizer becomes excellent in a case where the content of the polymerization initiator is 30 parts by mass or less.

<Crystallization Temperature>

From the viewpoint that the effects of the present invention become more excellent, the crystallization temperature of the composition of the present invention is preferably in a range of 0° C. to 100° C. and more preferably in a range of 15° C. to 85° C. In a case where the crystallization temperature of the composition of the present invention is lower than 0° C., a low-temperature device is required to crystallize the composition of the present invention. In a case where the temperature of the composition of the present invention is higher than 110° C., haze is likely to occur.

The crystallization temperature of the composition of the present invention is measured according to the same procedures as those for the crystallization temperature of the polymer liquid crystal compound described above except that the composition of the present invention is used in place of the polymer liquid crystal compound. The crystallization temperature of the above-described composition is considered to be the crystallization temperature of mixed crystals of the polymer liquid crystal compound and the dichroic material.

<Crystallinity of Specific Compound in Composition>

As described above, the crystallinity of the specific compound in the composition of the present invention is higher than the crystallinity of the specific compound alone.

Here, the crystallinity of the specific compound in the polarizer-forming composition can be evaluated by X-ray diffraction (XRD) measurement of a film (film 1) formed from the polarizer-forming composition. Further, the crystallinity of the specific compound alone can be evaluated by XRD measurement of a film (film 2) formed from the specific compound alone (only the specific compound).

Further, the crystal formed of the specific compound in the composition may be a crystal consisting of only the specific compound or a cocrystal formed of the specific compound and another component (for example, a dichroic material).

Hereinafter, how to determine that the crystallinity of the specific compound in the composition is higher than the crystallinity of the specific compound alone will be described.

(Preparation of Film)

The film 1 and the film 2 are prepared according to the same method. For example, care should be taken so that the concentrations of the coating solutions and the coating conditions are made uniform, and the areas and thicknesses of the films are the same.

The method of preparing the film 1 and the method of preparing the film 2 are not particularly limited as long as the methods are the same as each other. For example, the method of the present invention described below is exemplified. Further, as a typical example of the film 1, a polarizer produced according to the method of the present invention described below is exemplified. In a case where the film 1 contains an interface modifier, the film 2 is set as a film containing the same amount of the interface modifier as that of the film 1.

(XRD Measurement)

XRD measurement is performed on the film 1 and the film 2 under the same conditions (for example, the film thicknesses, the measurement areas, and the measurement conditions are made uniform).

For example, XRD measurement is performed as follows.

The XRD measurement is performed on the film 1 and the film 2 using an X-ray diffractometer for evaluating a thin film (trade name: "SmartLab", manufactured by Rigaku Corporation, in-plane optical system). Hereinafter, the X-ray diffraction analysis performed using the in-plane method is also described as "in-plane XRD". The in-plane XRD is performed by irradiating the surface of the polarizer layer with X-rays using a thin film X-ray diffractometer under the following conditions. Further, a direction in which the polymer liquid crystal and the dichroic material are aligned in a major axis direction is set as an azimuthal angle ($\varphi$) of 0°, and in-plane $\Delta$XRD is performed in all directions for every 15°, and the orientation in the substrate plane where the peak intensity becomes the maximum is determined by $\varphi$scan performed with respect to the observed peak. XRD spectra described below are compared using the spectra for in-plane measurement in the obtained orientation. For the peak intensity, a value standardized as a film thickness corresponding to the X-ray penetration length at an X-ray incidence angle of 0.2° is used.

(Comparison of XRD Spectra)

Since the film 1 and the film 2 contain the specific compound, a peak (peak A) having a half-width less than 2° (a peak derived from a crystal) and a peak (peak B) having a half-width of 2° or greater (halo) (a peak derived from a thermotropic liquid crystal) are observed in the XRD spectra measured as described above.

Further, from the viewpoint that the effects of the present invention become more excellent, the diffraction angle of the peak A is preferably less than 17°.

Further, from the viewpoint that the effects of the present invention become more excellent, the diffraction angle of the peak B is preferably 17° or greater.

In a case where at least any of the following condition (i) or the following condition (ii) is satisfied in a case of comparing the XRD spectra of the film 1 and the film 2, it is determined that the crystallinity of the specific compound in the composition is higher than the crystallinity of the specific compound alone. Conversely, in a case where neither of the following conditions (i) nor (ii) is satisfied, it is determined that the crystallinity of the specific compound in the composition is less than or equal to the crystallinity of the specific compound alone.

Condition (i): The peak intensity of the peak A of the film 1 is larger than the peak intensity of the peak A of the film 2. That is, the peak intensity ratio of the peak intensity of the peak A of the film 1 to the peak intensity of the peak A of the film 2 is greater than 1 (from the viewpoint that the effects of the present invention become more excellent, the peak intensity is preferably 1.2 or greater, more preferably 1.4 or greater, and still more preferably 1.5 or greater). In a case where a plurality of peaks A are observed in the XRD spectrum, the peak intensity ratio of at least one peak A is greater 1 (from the viewpoint that the effects of the present invention become more excellent, the peak intensity ratio of all peaks A is preferably greater than 1).

Condition (ii): A peak A which is not observed in the XRD spectrum of the film 2 is observed in the XRD spectrum of the film 1.

As described above, since the conditions of preparing the film 1 and the film 2 and the XRD measurement conditions are made uniform, the peaks of the XRD spectra can be compared.

Hereinafter, the description will be made using the XRD spectrum in detail.

FIG. 1 shows comparison between an XRD spectrum of a polarizer according to one embodiment (film 1) of the present invention using the following polymer liquid crystal compound L1 (specific compound) as a polymer liquid crystal compound and an XRD spectrum of a film (film 2) of the polymer liquid crystal compound L1 alone.

As can be seen from FIG. 1, the peaks a1 to a3 are observed as the peaks A in both the film 1 and the film 2. Since the peak intensity of the peak A of the film 1 is higher than the peak intensity of the peak A of the film 2, the above-described condition (i) is satisfied, and the crystallinity of the polymer liquid crystal compound L1 in the composition is determined to be higher than the crystallinity of the polymer liquid crystal compound L1 alone.

Figure 2:
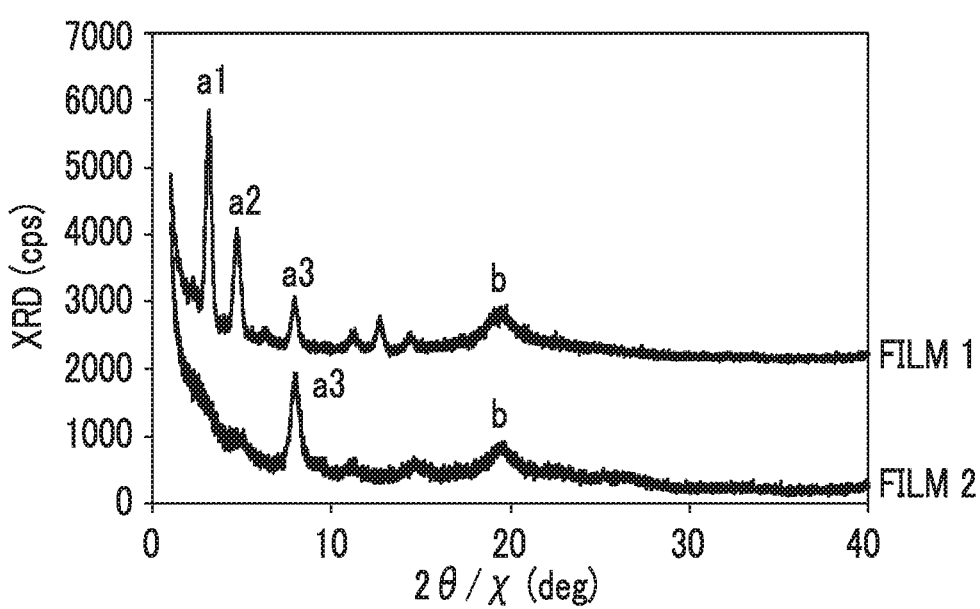
FIG. 2 shows comparison between an XRD spectrum of a polarizer according to one embodiment of the present invention using a polymer liquid crystal compound L2 and an XRD spectrum of a film of the polymer liquid crystal compound L2 alone.

Further, FIG. 2 shows comparison between an XRD spectrum of a polarizer according to one embodiment (film 1) of the present invention using the following polymer liquid crystal compound L2 (specific compound) as a polymer liquid crystal compound and an XRD spectrum of a film (film 2) of the polymer liquid crystal compound L2 alone.

As can be seen from FIG. 2, only the peak a3 is observed in the film 2 while the peaks a1 to a3 are observed as the peaks A in the film 1, and peaks A (a1 and a2) which are not observed in the XRD of the film 2 are observed in the XRD spectrum of the film 1, and thus the above-described condition (ii) is satisfied, and the crystallinity of the polymer liquid crystal compound L1 in the composition is determined to be higher than the crystallinity of the polymer liquid crystal compound L1 alone.

The method of increasing the crystallinity of the specific compound in the composition to be higher than the crystallinity of the specific compound alone is not particularly limited, and examples thereof include a method (method 1) of using those that form cocrystals as the specific compound and the dichroic material described above and a method (method 2) of using those with high compatibility as the specific compound and the dichroic material described above.

Examples of the suitable form of the above-described method 1 include the following suitable embodiment (the length of a planar structure). Further, examples of the suitable form of the above-described method 2 include the following suitable form (log P).

<Suitable Form (Length of Planar Structure)>

In the polarizer according to the embodiment of the present invention, from the viewpoint that the effects of the present invention become excellent, it is preferable that the specific compound described above has a planar structure (planar structure P), the dichroic material described above has a planar structure (planar structure Q), and a ratio R of the length (length p) of the planar structure P to the length (length q) of the planar structure Q is in a range of 0.91 to 1.50 (particularly in a range of 0.95 to 1.15).

Here, the length p indicates the length of the planar structure P in the longitudinal direction, and the length q indicates the length of the planar structure Q in the longitudinal direction.

Further, the ratio R represents any of the following (i) to (iii).

(i) q/p
(ii) 2q/p
(iii) q/2p

In (i) to (iii) described above, p represents the length p, and q represents the length q.

As described above, in a case where the length p of the planar structure P of the specific compound and the length q of the planar structure Q of the dichroic material satisfy a specific relationship, that is, the length of the planar structure of the specific compound and the length of the planar structure of the dichroic material are close to each other, it is assumed that π-π stacking becomes easier, the interaction between the structures becomes stronger, and the degree of alignment is improved.

Here, the relationship between the length of the planar structure of the specific compound and the length of the planar structure of the dichroic material includes not only the relationship between the length of one planar structure of the specific compound and the length of one planar structure of the dichroic material (corresponding to the case of (i) described above) but also the relationship between the length of two planar structures of the specific compound and the length of one planar structure of the dichroic material and the relationship between the length of one planar structure 1 of the specific compound and the length of two planar structures of the dichroic material (corresponding to the above-described cases (ii) to (iii)). This can be understood by considering an example of a combination of the specific compound and the dichroic material as described below.

Example of combination of specific compound and dichroic material

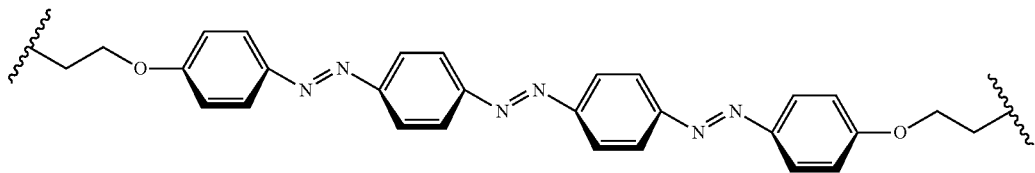

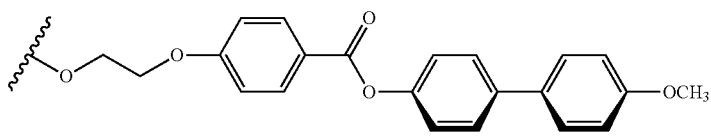

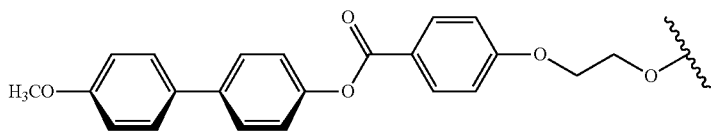

The planar structures P and Q are not particularly limited, but a planar structure represented by Formula (P1) is preferable.

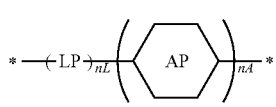

(P1)

In Formula (P1), the symbol "*" represents a bonding position, nL represents an integer of 0 to 6 and preferably an integer of 2 to 6, and nA represents an integer of 1 to 7 and preferably an integer of 2 to 5.

In Formula (P), AP represents an aromatic ring or a hetero ring which may have a substituent (for example, a substituent W described below).

Examples of the aromatic ring include a benzene ring, a naphthalene ring, an anthracene ring, a phenanthrene ring, a fluorene ring, a triphenylene ring, a tetracene ring, a pyrene ring, a benzopyrene ring, a picene ring, a perylene ring, a pentacene ring, a hexacene ring, a heptacene ring, and a coronene ring.

Further, examples of the hetero ring include a furan ring, a thiophene ring, a pyrrole ring, a pyrroline ring, a pyrrolidine ring, an oxazole ring, an isoxazole ring, a thiazole ring, an isothiazole ring, an imidazole ring, an imidazoline ring, an imidazolidine ring, a pyrazole ring, a pyrazoline ring, a pyrazolidine ring, a triazole ring, a furazane ring, a tetrazole ring, a pyran ring, a thiine ring, a pyridine ring, a piperidine ring, an oxazine ring, a morpholine ring, a thiazine ring, a pyridazine ring, a pyrimidine ring, a pyrazine ring, a piperazine ring, a triazine ring, a benzofuran ring, an isobenzofuran ring, a benzothiophene ring, an indole ring, an indoline ring, an isoindole ring, a benzoxazole ring, a benzothiazole ring, an indazole ring, a benzimidazole ring, a quinoline ring, an isoquinoline ring, a cinnoline ring, a phthalazine ring, a quinazoline ring, a quinoxaline ring, a dibenzofuran ring, a dibenzothiophene ring, a carbazole ring, a xanthene ring, an acridine ring, a phenanthridine ring, a phenanthroline ring, a phenazine ring, a phenoxazine ring, a thianthrene ring, an indolizine ring, a quinolidine ring, a quinuclidine ring, a naphthyridine ring, a purine ring, and a pteridine ring.

In Formula (P1), LP represents a linking portion that forms the above-described planar structure by being linked to the AP, and specific examples thereof include a single bond, —N=N—, —CZ1=CZ2-, and —C=C—, —CZ1=N—, and —CZ1=N—N=CZ2-.

(Z1 and Z2 each independently represent a hydrogen atom, a halogen atom, a cyano group, an alkyl group having 1 to 6 carbon atoms, or an alkoxy group having 1 to 6 carbon atoms.)

Among these linking portions, a single bond, —CZ1=CZ2-, —C=C—, —CZ1=N—, or —CZ1=N—N=CZ2- is preferable from the viewpoint that the absorption wavelength in the specific compound is preferably 400 nm or less. Further, it is preferable that the dichroic material contains at least one —N=N— from the viewpoint that the absorption wavelength in the dichroic material is preferably 400 nm or less.

In the planar structure represented by Formula (P1), the lengths p and q indicate the length of an atomic group including atoms (adjacent atoms) directly connected to AP or LP. Specifically, in Formula (D8), the lengths p and q indicate the length of the structure in the dotted frame (length in the longitudinal direction).

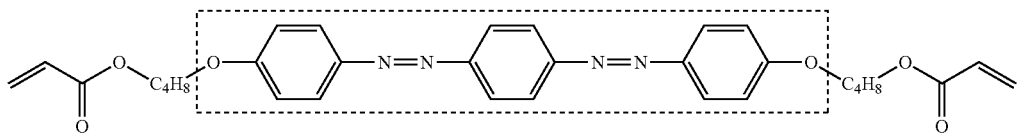

However, in a case of a combination of the length of two planar structures of the specific compound and the length of one planar structure of the dichroic material and a combination of the length of one planar structure of the specific liquid crystal compound and the length of two planar structures of the dichroic material, it is easily understood that the lengths to the terminals of molecules correspond to each other based on the example of the combination of the specific compound and the dichroic material described above. Specifically, in Formula (L2), the length indicates the length of the structure within the dotted frame.

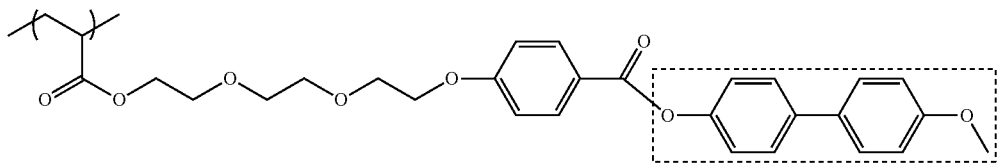

The length p of the planar structure P of the specific compound and the length q of the planar structure Q of the dichroic material can be calculated using ChemBio3D @ Ultra (Ver. 13.0).

<Suitable Form (Log P)>

In the polarizer according to the embodiment of the present invention, from the viewpoint that the effects of the present invention become excellent, an absolute value (Δ log P) of the difference between the log P value of the above-described specific compound and the log P value of the above-described dichroic material is preferably 8.0 or less, more preferably 7.0 or less, still more preferably 6.0 or less, and particularly preferably 5.0 or less. The lower limit of Δ log P is not particularly limited, and the value is 0.

As described above, the reason why the degree of alignment is improved in a case where Δ log P is 8.0 or less is assumed to be that it is advantageous for the interaction in a case where the properties of the specific compound and the properties of the dichroic material are similar to each other.

Further, the log P value described above is an index for expressing the hydrophilicity and hydrophobicity of the chemical structure and is sometimes referred to as a hydrophilic-hydrophobic parameter. The log P value can be calculated using software such as ChemBioDrawUltra or HSPiP (Ver. 4.1.07). Also, the log P value can be obtained experimentally by the method of the OECD Guidelines for the Testing of Chemicals, Sections 1, Test No. 117 or the like. In the present invention, a value calculated by inputting the structure of a compound to HSPiP (Ver. 4.1.07) is employed as a log P value unless otherwise specified.

<Substituent W>

The substituent W in the present specification will be described.

Examples of the substituent W include a halogen atom, an alkyl group (such as a tert-butyl group) (including a cycloalkyl group, a bicycloalkyl group, and a tricycloalkyl group), an alkenyl group (including a cycloalkenyl group and a bicycloalkenyl group), an alkynyl group, an aryl group, a heterocyclic group, a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonium group, an acylamino group, an aminocarbonylamino group, an alkoxycarbonylamino group, an aryloxycarbonylamino group, a sulfamoylamino group, an alkyl or arylsulfonylamino group, a mercapto group, an alkylthio group, an arylthio group, a heterocyclic thio group, a sulfamoyl group, a sulfo group, an alkyl or arylsulfinyl group, an alkyl or arylsulfonyl group, an acyl group, an aryloxycarbonyl group, an alkoxycarbonyl group, a carbamoyl, an aryl or heterocyclic azo group, an imide group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)), a sulfate group (—OSO$_3$H), and other known substituents.

The details of the substituent are described in paragraph [0023] of JP2007-234651A.

[Horizontal Alignment]

As described above, in the polarizer of the present invention, the specific compound and the dichroic material are horizontally aligned.

Here, the horizontal alignment indicates that the specific compound and the dichroic material are aligned to be parallel to the main surface of the polarizer, but these are not required to be strictly parallel, and the average tilt angle with the horizontal plane is less than ±10 degrees. Further, the tilt angle can be measured using AxoScan OPMF-1 (manufactured by Opto Science, Inc.).

Specifically, an extinction coefficient ko [λ] (in-plane direction) and an extinction coefficient ke [λ] (thickness direction) are calculated using AxoScan OPMF-1 (manufactured by Opto science, Inc.) by calculating the Mueller matrix of the polarizer at a wavelength λ and at room temperature based on the polar angle measured for every 10° from −50° to 50°, removing the influence of the surface reflection, and fitting the result to the following theoretical formula in consideration of the Snell's formula and Fresnel's equations. Unless otherwise specified, the wavelength λ is 550 nm.

$$k=-\log(T)\times\lambda/(4\pi d)$$

Here, T represents the transmittance, and d represents the thickness of the polarizer.

By calculating the absorbance and the dichroic ratio in the in-plane direction and the thickness direction based on the calculated ko [λ] and ke [λ], it can be confirmed whether the specific compound and the dichroic material are horizontally aligned.

[Thickness]

From the viewpoint that the effects of the present invention become more excellent, the film thickness of the polarizer according to the embodiment of the present invention is preferably in a range of 0.1 to 5.0 μm and more preferably in a range of 0.3 to 1.5 μm. Although it depends on the concentration of the dichroic material in the composition, a polarizer with an excellent absorbance is obtained in a case where the film thickness is 0.1 μm or greater, and a polarizer with an excellent transmittance is obtained in a case where the film thickness is 5.0 μm or less.

[Method of Producing Polarizer]

The method of producing the polarizer according to the embodiment of the present invention is not particularly limited, but a method comprising a step of coating an alignment film with the above-described composition of the present invention to form a coating film (hereinafter, also referred to as a "coating film forming step") and a step of aligning a dichroic material contained in the coating film (hereinafter, also referred to as an "aligning step") in this order (hereinafter, also referred to as the "method of the present invention") is preferable from the viewpoint that the degree of alignment of the polarizer to be obtained becomes higher. Hereinafter, "the degree of alignment of the polarizer to be obtained becomes higher" will also be referred to as "the effects of the present invention become more excellent".

Hereinafter, each step will be described.

<Coating Film Forming Step>

The coating film forming step is a step of coating the alignment film with the above-described composition of the present invention to form a coating film. The specific compound in the coating film is horizontally aligned due to an interaction between the alignment film and an interface modifier (in a case where the composition of the present invention contains an interface modifier).

The alignment film can be easily coated with the composition of the present invention by using the composition of the present invention which contains the above-described solvent or using a liquid such as a melt obtained by heating the composition of the present invention.

Examples of the method of coating the film with the composition of the present invention include known methods such as a roll coating method, a gravure printing method, a spin coating method, a wire bar coating method, an extrusion coating method, a direct gravure coating method, a reverse gravure coating method, a die coating method, a spraying method, and an inkjet method.

(Alignment Film)

An alignment film may be any film as long as the film allows the specific compound contained in the composition of the present invention to be horizontally aligned.

An alignment film can be provided by means such as a rubbing treatment performed on a film surface of an organic compound (preferably a polymer), oblique deposition of an inorganic compound, formation of a layer having microgrooves, or accumulation of an organic compound (such as ω-tricosanoic acid, dioctadecylmethylammonium chloride, or methyl stearylate) according to a Langmuir-Blodgett method (LB film). Further, an alignment film in which an alignment function is generated by application of an electric field, application of a magnetic field, or irradiation with light is also known. Among these, in the present invention, an alignment film formed by performing a rubbing treatment is preferable from the viewpoint of easily controlling the pretilt angle of the alignment film, and a photo-alignment film formed by irradiation with light is also preferable from the viewpoint of the uniformity of alignment.

(1) Rubbing Treatment Alignment Film

A polymer material used for the alignment film formed by performing a rubbing treatment is described in multiple documents, and a plurality of commercially available products can be used. In the present invention, polyvinyl alcohol or polyimide and derivatives thereof are preferably used. The alignment film can refer to the description on page 43, line 24 to page 49, line 8 of WO2001/88574A1. The thickness of the alignment film is preferably in a range of 0.01 to 10 μm and more preferably in a range of 0.01 to 1 μm.

(2) Photo-Alignment Film

A photo-alignment material used for an alignment film formed by irradiation with light is described in a plurality of documents. In the present invention, preferred examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having a photo-alignment unit described in JP2002-265541 A and JP2002-317013A, photocrosslinkable silane derivatives described in JP4205195B and JP4205198B, photocrosslinkable polyimides, polyamides, or esters described in JP2003-520878A, JP2004-529220A, and JP4162850B. Among these, azo compounds, photocrosslinkable polyimides, polyamides, or esters are more preferable.

The photo-alignment film formed of the above-described material is irradiated with linearly polarized light or non-polarized light to produce a photo-alignment film.

In this specification, the "irradiation with linearly polarized light" and the "irradiation with non-polarized light" are operations for causing a photoreaction in the photo-alignment material. The wavelength of the light to be used varies depending on the photo-alignment material to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic polarizing plate, or a wire grid polarizing plate), a method of using a prism-based element (for example, a Glan-Thompson prism) or a reflective polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment film or the surface of the alignment film from the rear surface is employed. The incidence angle of light varies depending on the photo-alignment material, but is preferably in a range of 0 to 90° (vertical) and more preferably in a range of 40 to 90°.

In a case where light to be applied is non-polarized light, the alignment film is irradiated with non-polarized light obliquely. The incidence angle is preferably in a range of 10 to 80°, more preferably in a range of 20 to 60°, and still more preferably in a range of 30 to 50°.

The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

<Aligning Step>

The aligning step is a step of aligning the dichroic material contained in the coating film. In this manner, the polarizer according to the embodiment of the present invention is obtained. In the aligning step, the dichroic material is considered to be aligned along the specific compound aligned by the alignment film.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

Here, the dichroic material contained in the composition of the present invention may be aligned by performing the above-described coating film forming step or drying treatment. For example, in a form in which the composition of the present invention is prepared as a coating solution containing a solvent, the polarizer according to the embodiment of the present invention may be obtained by drying the coating film and removing the solvent from the coating film so that the dichroic material contained in the coating film is aligned.

It is preferable that the aligning step includes a heat treatment. In this manner, the dichroic material contained in the coating film is further aligned, and the degree of alignment of the polarizer to be obtained becomes higher.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the dichroic material contained in the coating film is further fixed, and the degree of alignment of the polarizer to be obtained is further increased. The cooling unit is not particularly limited and the cooling can be performed according to a known method.

The polarizer according to the embodiment of the present invention can be obtained by performing the above-described steps.

[Other Steps]

The method of the present invention may include a step of curing the polarizer after the aligning step (hereinafter, also referred to as a "curing step").

The curing step is performed by, for example, heating the film and/or irradiating (exposing) the film with light. Between these, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

Further, the exposure may be performed under a nitrogen atmosphere. In a case where the curing of the polarizer proceeds by radical polymerization, from the viewpoint of reducing inhibition of polymerization by oxygen, it is preferable that exposure is performed in a nitrogen atmosphere.

[Laminate]

The laminate of the present invention includes a base material, an alignment film provided on the base material, and the above-described polarizer according to the embodiment of the present invention provided on the alignment film.

Further, the laminate of the present invention may include a λ/4 plate on the polarizer according to the embodiment of the present invention.

Further, the laminate of the present invention may include a barrier layer between the polarizer according to the embodiment of the present invention and the λ/4 plate.

Hereinafter, each layer constituting the laminate of the present invention will be described.

[Base Material]

The base material can be appropriately selected, and examples thereof include glass and a polymer film. The light transmittance of the base material is preferably 80% or greater. In a case where a polymer film is used as the base material, it is preferable to use an optically isotropic polymer film. As specific examples and preferred embodiments of the polymer, the description in paragraph [0013] of JP2002-022942A can be applied. Further, even in a case of a polymer easily exhibiting the birefringence such as polycarbonate and polysulfone which has been known in the related art, a polymer with the exhibiting property which has been reduced by modifying the molecules described in WO2000/26705A can be used.

[Alignment Film]

The alignment film is as described above, and thus the description thereof will not be repeated.

[Polarizer]

The polarizer according to the embodiment of the present invention is as described above, and thus the description will not be repeated.

[λ/4 Plate]

A "λ/4 plate" is a plate having a λ/4 function, specifically, a plate having a function of converting linearly polarized light having a specific wavelength into circularly polarized light (or converting circularly polarized light into linearly polarized light).

For example, specific examples of a form in which a λ/4 plate has a single-layer structure include a stretched polymer film and a phase difference film in which an optically anisotropic layer having a λ/4 function is provided on a support. Further, specific examples of a form in which a λ/4 plate has a multilayer structure include a broadband λ/4 plate obtained by laminating a λ/4 plate and a λ/2 plate.

The λ/4 plate and the polarizer according to the embodiment of the present invention may be provided by coming into contact with each other, or another layer may be provided between the λ/4 plate and the polarizer according to the embodiment of the present invention. Examples of such a layer include a pressure sensitive adhesive layer or an adhesive layer for ensuring the adhesiveness, and a barrier layer.

[Barrier Layer]

In a case where the laminate of the present invention comprises a barrier layer, the barrier layer is provided between the polarizer according to the embodiment of the present invention and the λ/4 plate. Further, in a case where a layer other than the barrier layer (for example, a pressure sensitive adhesive layer or an adhesive layer) is comprised between the polarizer according to the embodiment of the present invention and the λ/4 plate, the barrier layer can be provided, for example, between the polarizer according to the embodiment of the present invention and the layer other than the barrier layer.

The barrier layer is also referred to as a gas barrier layer (oxygen barrier layer) and has a function of protecting the polarizer according to the embodiment of the present invention from gas such as oxygen in the atmosphere, the moisture, or the compound contained in an adjacent layer.

The barrier layer can refer to, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Applications]

The laminate of the present invention can be used as a polarizing element (polarizing plate) or the like, for example, as a linear polarizing plate or a circularly polarizing plate.

In a case where the laminate of the present invention does not include an optically anisotropic layer such as the λ/4 plate, the laminate can be used as a linear polarizing plate.

Meanwhile, in a case where the laminate of the present invention includes the λ/4 plate, the laminate can be used as a circularly polarizing plate.

[Image Display Device]

An image display device according to the embodiment of the present invention includes the above-described polarizer according to the embodiment of the present invention or the above-described laminate of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, in the image display device of the present invention, a liquid crystal display device obtained by using a liquid crystal cell as a display element or an organic EL display device obtained by using an organic EL display panel as a display element is preferable, and a liquid crystal display device is more preferable.

[Liquid Crystal Display Device]

As a liquid crystal display device which is an example of the image display device according to the embodiment of the present invention, a form of a liquid crystal display device including the above-described polarizer according to the embodiment of the present invention and a liquid crystal cell is preferably exemplified. A liquid crystal display device including the above-described laminate of the present invention (here, the laminate does not include a λ/4 plate) and a liquid crystal cell is more suitable.

In the present invention, between the polarizing elements provided on both sides of the liquid crystal cell, it is preferable that the laminate of the present invention is used as a front-side polarizing element and more preferable that the laminate of the present invention is used as a front-side polarizing element and a rear-side polarizing element.

Hereinafter, the liquid crystal cell constituting the liquid crystal display device will be described in detail.

<Liquid Crystal Cell>

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystalline molecules are substantially horizontally aligned in a case of no voltage application and further twisted aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystalline molecules are substantially vertically aligned in the case of no voltage application. The concept of the liquid crystal cell in a VA mode includes (1) a liquid crystal cell in a VA mode in a narrow sense where rod-like liquid crystal molecules are aligned substantially vertically in the case of no voltage application and substantially horizontally in a case of voltage application (described in JP1992-176625A (JP-H02-176625A)), (2) a liquid crystal cell (in an MVA mode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned in the case of no voltage application and twistedly multi-domain aligned in the case of voltage application (described in proceedings of Japanese Liquid Crystal Conference, p. 58 to 59 (1998)), and (4) a liquid crystal cell in a SURVIVAL mode (presented at LCD International 98). Further, the liquid crystal cell may be of any of a patterned vertical alignment (PVA) type, a photo-alignment (optical alignment) type, and a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-054982A (JP-H10-054982), JP1999-202323A (JP-H11-202323), JP1998-292522A (JP-H9-292522A), JP1999-133408A (JP-H11-133408A), JP1999-305217A (JP-H11-305217A), and JP1998-307291A (JP-H10-307291A).

[Organic EL Display Device]

As an organic EL display device which is an example of the image display device according to the embodiment of the present invention, a form of a display device including the above-described polarizer according to the embodiment of the present invention, a λ/4 plate, and an organic EL display panel in this order from the viewing side is suitably exemplified.

A form of a display device including the above-described laminate of the present invention which includes a λ/4 plate and an organic EL display panel in this order from the viewing side is more suitably exemplified. In this case, the laminate is formed such that a base material, an alignment film, the polarizer according to the embodiment of the present invention, a barrier layer provided as necessary, and a λ/4 plate are disposed in this order from the viewing side.

Further, the organic EL display panel is a display panel formed using an organic EL element having an organic light-emitting layer (organic electroluminescence layer) interposed between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

Synthesis Example

[Polymer Liquid Crystal Compound]
<Polymer Liquid Crystal Compound L2>

A polymer liquid crystal compound L2 was synthesized according to the following procedures.

(Synthesis of Compound L1-1)

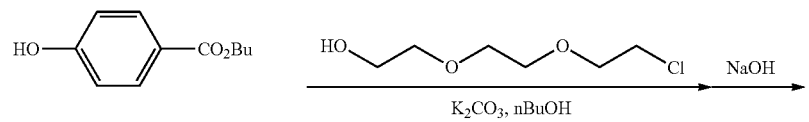

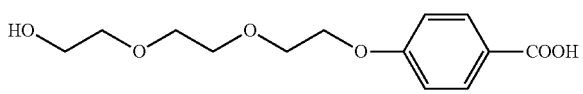

(L1-1)

Butylparaben (300 g) and potassium carbonate (299 g) were added to a solution of 2-chloroethoxyethoxyethanol (365 g) in normal butanol (480 mL). After the solution was stirred at 100° C. for 18 hours, water (1050 mL) was added thereto, and the reaction solution was washed by performing a liquid separation operation. A 22 wt % (22 mass %) sodium hydroxide aqueous solution (420 g) was added to the obtained organic layer, and the solution was stirred at 50° C. for 3 hours. Thereafter, the temperature was returned to room temperature, concentrated hydrochloric acid was added dropwise thereto until the pH thereof reached 3, and the reaction solution was washed by performing the liquid separation operation. The obtained organic layer was added dropwise to a mixed solution of isopropyl alcohol (540 mL) and normal hexane (1260 mL) which had been cooled to 10° C. or lower, and the resultant was filtered, thereby obtaining 361 g (yield of 87%) of a white solid compound (L1-1).

¹H-NMR (solvent: DMSO (dimethyl sulfoxide) -d6) δ (ppm): 3.38-3.64 (m, 8H), 3.73-3.79 (m, 2H), 4.13-4.19 (m, 2H), 4.58 (br s, 1H), 6.98-7.05 (m, 2H), 7.85-7.90 (m, 2H), 12.63 (br s, 1H)

(Synthesis of Compound L1-2)

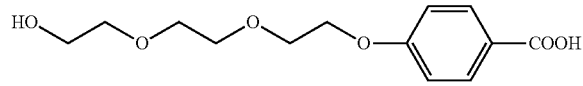 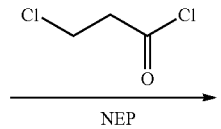

(L1-1)

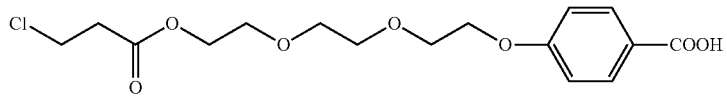

(L1-2)

300 g of the white solid compound (L1-1) was dissolved in N-ethylpyrrolidone (450 mL) and ethyl acetate (800 mL), and the internal temperature was lowered to 5° C. Next, 3-chloropropionic chloride (169 g) was added dropwise thereto such that the internal temperature did not rise above 15° C. or higher. After the solution was stirred at 10° C. for 3 hours, 10 wt % saline (1200 mL) was added thereto, and liquid separation was performed at room temperature. 10 wt % saline (1200 mL) was added to the obtained organic layer again, and liquid separation was performed. Thereafter, methanol (750 mL) and water (750 mL) were added dropwise to the organic layer while stirring, the resulting solution was cooled to 15° C., and water (300 mL) was added dropwise thereto again. Next, 332 g (yield of 83%) of a white solid compound (L1-2) was obtained by performing a filtration operation.

¹H-NMR (solvent: CDCl₃) δ (ppm): 2.82 (t, 2H), 3.65-3.83 (m, 8H), 3.85-3.95 (m, 2H), 4.15-4.25 (m, 2H), 4.25-4.35 (m, 2H), 6.93-7.00 (m, 2H), 8.02-8.08 (m, 2H)

(Synthesis of Compound L1-3)

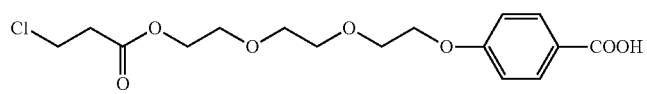 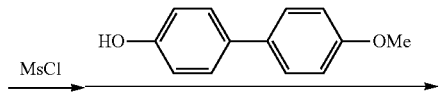

(L1-2)

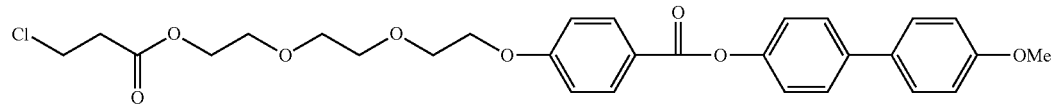

(L1-3)

A solution of methanesulfonyl chloride (56 g) in ethyl acetate (253 mL) was cooled until the internal temperature thereof reached 0° C. Next, the compound (L1-2) (168 g) and a solution of diisopropylethylamine (DIPEA) (63 g) and dibutylhydroxytoluene (BHT) (930 mg) in ethyl acetate (253 mL) were added dropwise thereto such that the internal temperature thereof did not rise above 10° C. or higher. After the solution was stirred at 5° C. for 1 hour, 4-hydroxy-4'-methoxybiphenyl (85 g) and N-methylimidazole (17 g) were added thereto, and diisopropylethylamine (55 g) was added dropwise thereto such that the internal temperature did not rise above 10° C. or higher. Thereafter, the solution was stirred at room temperature for 4 hours. An aqueous solution in which 34 g of sodium chloride and 0.5 N aqueous hydrochloric acid (660 mL) were mixed was added to the reaction solution to stop the reaction, and a liquid separation operation was performed. Acetonitrile (168 mL) and methanol (842 mL) were added to the extracted organic layer while the solution was stirred, and water (337 mL) was added dropwise thereto. Thereafter, the solution was cooled to 0° C. and filtered, thereby obtaining 219 g (yield of 95%) of a compound (L1-3) as a white solid. In the structural formula, Me represents a methyl group.

$^1$H-NMR (solvent: CDCl$_3$) δ (ppm): 2.83 (t, 2H) 3.65-3.80 (m, 8H), 3.86 (s, 3H), 3.87-3.95 (M, 211), 4.18-4.26 (m, 211), 4.27-4.35 (m, 211), 6.95-7.05 (m, 411), 7.22-7.28 (m, 2H), 7.48-7.62 (m, 4H), 8.14-8.18 (m, 2H)

(Synthesis of Compound L1-4)

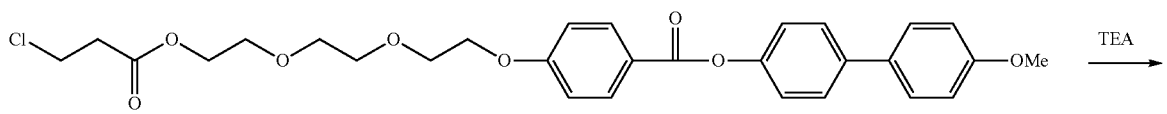

(L1-3)

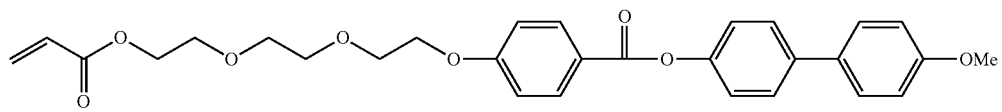

(L1-4)

The compound (L1-3) (160 g) and dibutylhydroxytoluene (BHT) (1300 mg) were dissolved in a mixed solution of ethyl acetate (180 mL), toluene (176 mL), and acetonitrile (208) mL, and then triethylamine (60 g) was added dropwise thereto. The resulting solution was stirred at 60° C. for 3 hours. After the solution was cooled to room temperature, 1N (1 N) aqueous hydrochloric acid (288 mL) was added to the reaction solution to stop the reaction, and a liquid separation operation was performed. After the extracted organic layer was filtered using a filter, methanol (960 mL) was added dropwise thereto while the solution was stirred. Thereafter, the solution was cooled to 0° C. and filtered, thereby obtaining 138 g (yield of 93%) of a compound (L1-4) as a white solid. The purity of the compound was 98%.

$^1$H-NMR (solvent: CDCl$_3$) δ (ppm): 3.68-3.80 (m, 6H), 3.85 (s, 3H), 3.87-3.94 (m, 2H), 4.18-4.26 (m, 2H), 4.32-4.38 (m, 2H), 5.83 (dd, 1H), 6.16 (dd, 1H), 6.43 (dd, 1H), 6.95-7.05 (m, 4H), 7.22-7.28 (m, 2H), 7.48-7.62 (m, 4H), 8.13-8.20 (m, 2H)

The following compound (L1-b) was contained as an impurity.

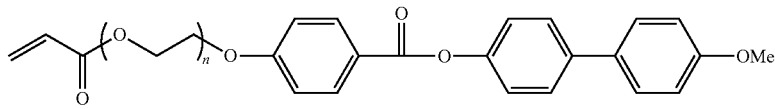

n represents an integer other than 3 (L1-b)

(Synthesis of Polymer Liquid Crystal Compound L2)

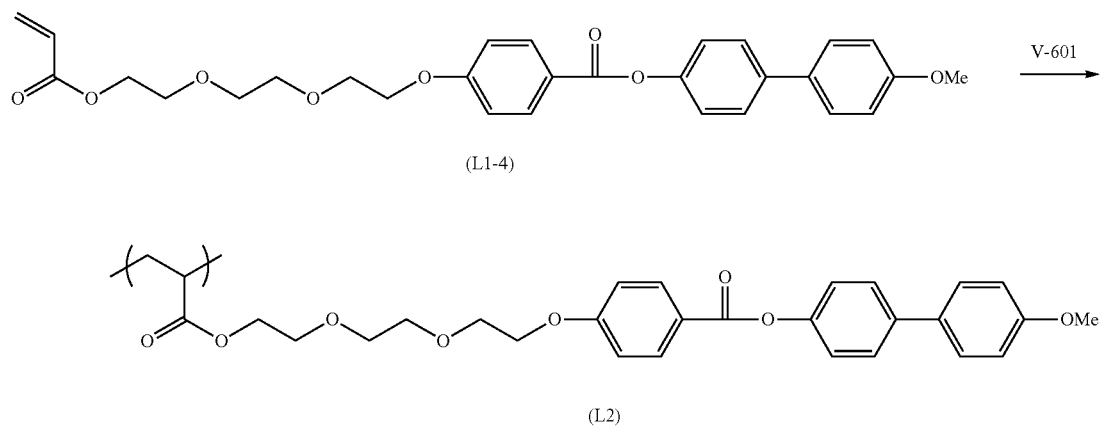

(L1-4)

(L2)

The compound (L1-4) (55 g) and dibutylhydroxytoluene (BHT) (83 mg) were dissolved in anisole (178 g). Dimethyl 2,2'-azobis (2-methylpropionate) (885 mg) (trade name "V-601") was added thereto at room temperature, and the resulting solution was stirred. The obtained anisole solution was added dropwise to anisole (44 g), which had been heated to 80° C. in a nitrogen atmosphere, for 2 hours, and the solution was stirred at 80° C. for 4 hours after the dropwise addition. The obtained reaction solution was added dropwise to methanol (570 mL), and the precipitate was collected by filtration, and the residue was washed with acetonitrile, thereby obtaining 52 g (yield of 95%) of a white solid compound (12). The weight-average molecular weight (Mw) of the obtained polymer was 13500.

Further, the molecular weight was calculated by gel permeation chromatography (GPC) in terms of polystyrene, three of TOSOH TSKgel Super AWM-11 (manufactured by Tosoh Corporation) were connected to each other and used as columns, and N-methylpyrrolidone was used as a solvent.

<Synthesis of Polymer Liquid Crystal Compound L>

A polymer liquid crystal compound L1 was synthesized by performing the following steps 1 and 2.

(Step 1)

Methyl 4-(4-hydroxyphenyl) benzoate was synthesized according to the method described in Journal of Polymer Science, Part A: Polymer Chemistry, 2012, vol. 50, p. 3936 to 3943.

A solution (300 mL) of methanesulfonyl chloride (66 g) in toluene was cooled until the internal temperature thereof reached 0° C. The compound (L1-21) (the same compound as the compound L1-2 described above) (200 g), diisopropylethylamine (DIPEA) (75 g), and a solution of dibutylhydroxytoluene (BHT) (2.2 g) in tetrahydrofuran (400 mL) were added dropwise thereto such that the internal temperature did not rise above 10° C. or higher. After the solution was stirred at 5° C. for 1 hour, methyl 4-(4-hydroxyphenyl) benzoate (115 g), acetonitrile (200 mL), and N-methylimidazole (21 g) were added thereto, and diisopropylethylamine (65 g) was added dropwise thereto such that the internal temperature did not rise above 10° C. or higher. Thereafter, the solution was stirred at room temperature for 4 hours. An aqueous solution obtained by mixing 40 g of sodium chloride and 0.5 N aqueous hydrochloric acid (800 mL) was added to the reaction solution to stop the reaction, and a liquid separation operation was performed. Methanol (1400 mL) was added dropwise to the extracted organic layer while

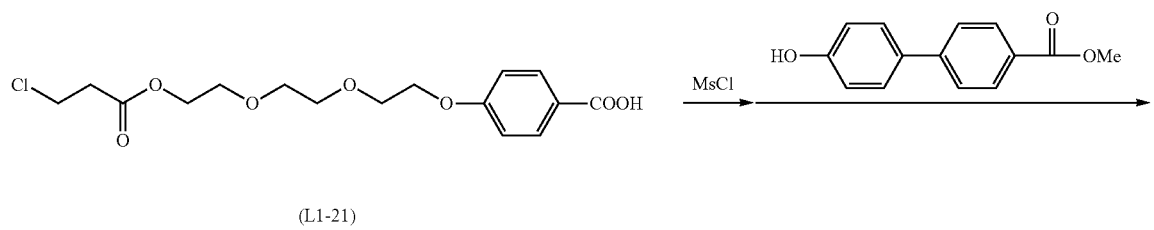

(L1-21)

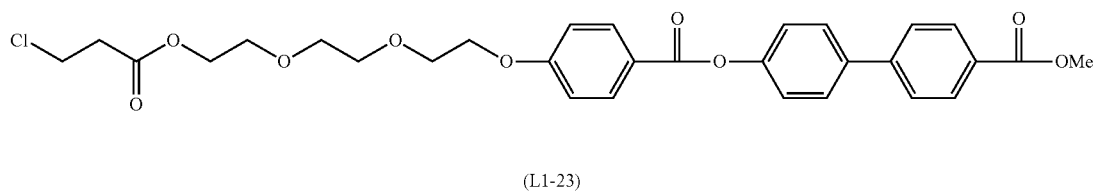

(L1-23)

the solution was stirred. Thereafter, the solution was cooled to 0° C. and filtered, thereby obtaining 258 g (yield of 90%) of a compound (L1-23) as a white solid.

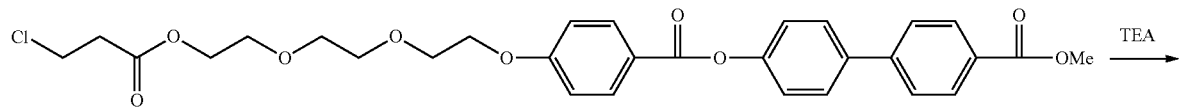

(L1-23)

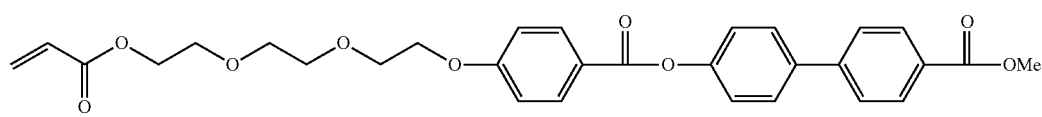

(L1-24)

The compound (L1-23) (50 g) and dibutylhydroxytoluene (BHT) (390 mg) were dissolved in a mixed solution of ethyl acetate (75 mL), toluene (50 mL), and acetonitrile (50) mL, and triethylamine (18 g) was added dropwise thereto. The resulting solution was stirred at 60° C. for 3 hours. After the solution was cooled to room temperature, 1N aqueous hydrochloric acid (88 mL) was added to the reaction solution to stop the reaction, and a liquid separation operation was performed. After the extracted organic layer was filtered using a filter, methanol (300 mL) was added dropwise thereto while the solution was stirred. Thereafter, the solution was cooled to 0° C. and filtered, thereby obtaining 41 g (yield of 93%) of a compound (L1-24) as a white solid. The purity of the compound was 98%.

$^1$H-NMR (solvent: CDCl$_3$) δ (ppm): 3.68-3.80 (m, 6H), 3.87-3.95 (m, 2H), 3.95 (s, 3H), 4.20-4.27 (m, 2H), 4.31-4.37 (m, 2H), 5.83 (dd, 1H), 6.16 (dd, 1H), 6.43 (dd, 1H), 6.97-7.05 (m, 2H), 7.28-7.35 (m, 2H), 7.64-7.72 (m, 4H), 8.08-8.20 (m, 4H)

The following compound (L1-2b) was contained as an impurity.

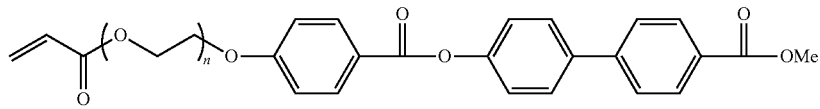

n represents an integer other than 3 (L1-2b)
(Step 2)

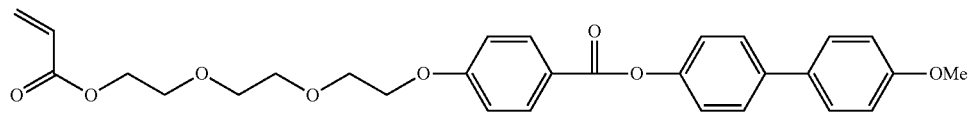

(L1-14)

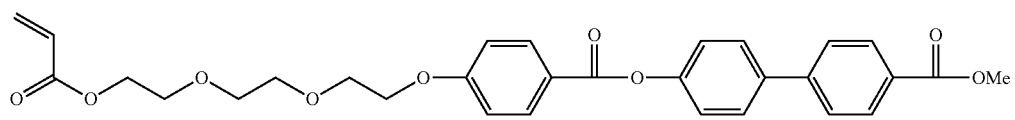

(L1-24)

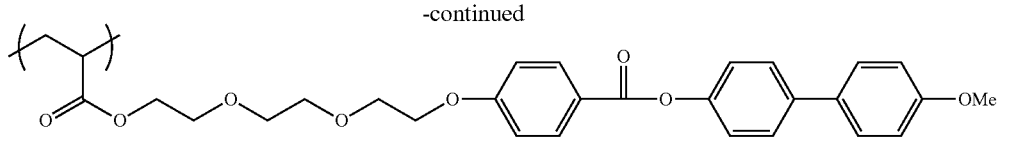

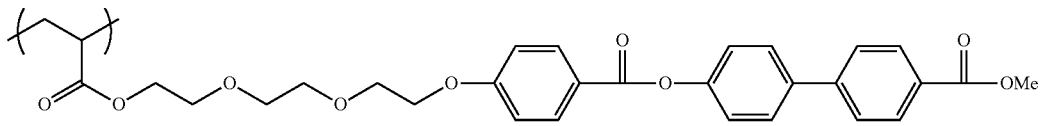

(L1)

The compound (L1-4) (84 g) synthesized as described above, the compound (L1-24) (21 g) synthesized as described above, and dibutylhydroxytoluene (BHT) (158 mg) were dissolved in anisole (337 g). Dimethyl 2,2'-azobis (2-methylpropionate) (1660 mg) (trade name "V-601") was added thereto at room temperature, and the solution was stirred. The obtained anisole solution was added dropwise to anisole (84 g) heated to 80° C. in a nitrogen atmosphere for 2 hours, and the resulting solution was stirred at 80° C. for 4 hours after the dropwise addition. The obtained reaction solution was added dropwise to methanol (1080 mL), and the precipitate was collected by filtration, and the residue was washed with acetonitrile, thereby obtaining 100 g (yield 95%) of a compound (L1) as a white solid. The weight-average molecular weight (Mw) of the obtained polymer was 13300.

Further, the molecular weight was calculated by gel permeation chromatography (GPC) in terms of polystyrene, three of TOSOH TSKgel Super AWM-H (manufactured by Tosoh Corporation) were connected to each other and used as columns, and N-methylpyrrolidone was used as a solvent.

<Polymer Liquid Crystal Compounds L3 and L4>

The polymer liquid crystal compounds L3 and L4 described below were synthesized according to the same method as that for the polymer liquid crystal compounds described above or according to a known method.

[Dichroic Material]

<Dichroic Material D1>

First, 4-hydroxybutyl acrylate (20 g) and mesyl chloride (16.8 g, MsCl) were dissolved in ethyl acetate (90 mL), and then triethylamine (16.4 g, NEt$_3$) was added dropwise thereto while the solution was cooled in an ice bath. Thereafter, the resulting solution was stirred at room temperature for 2 hours, and 1N HCl was added thereto to perform liquid separation. The obtained organic layer was distilled off under reduced pressure, thereby obtaining a compound X (30 g) with the following structure.

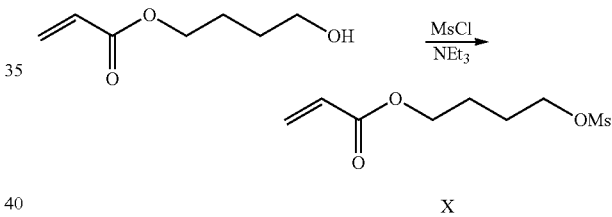

X

Further, the dichroic material D1 was synthesized according to the following route.

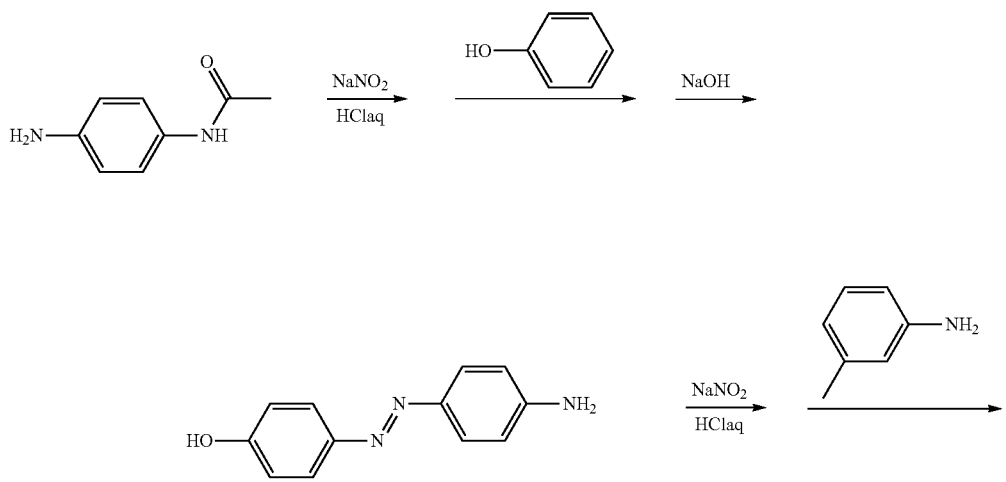

A

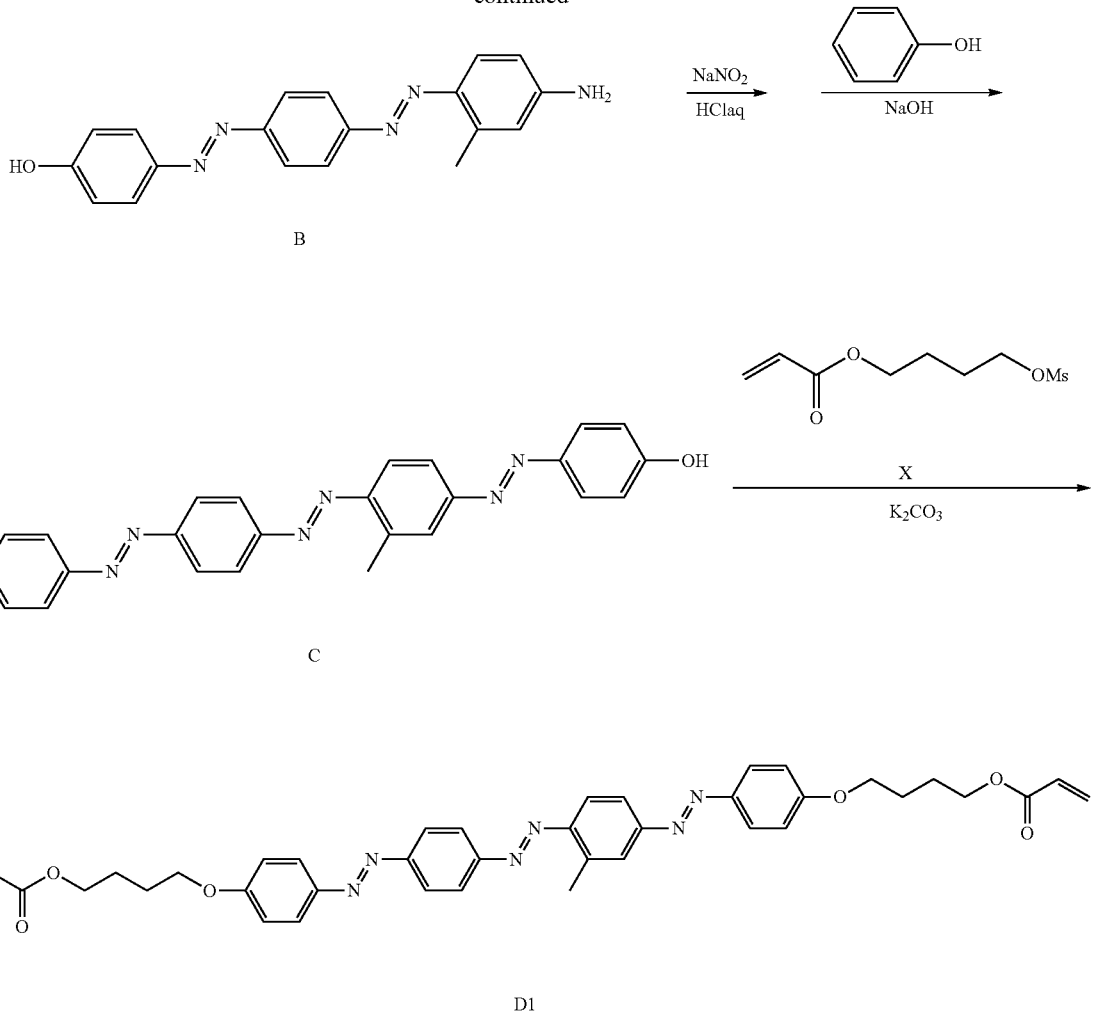

First, a compound A (10 g) was synthesized according to the literature (Chem. Eur. J. 2004. 10. 2011).

The compound A (10 g) was dissolved in water (300 mL) and hydrochloric acid (17 mL), the solution was cooled in an ice bath, sodium nitrite (3.3 g) was added thereto, and the resulting solution was stirred for 30 minutes. Further, m-toluidine (5.1 g) was added thereto after addition of amidosulfuric acid (0.5 g), and the solution was stirred at room temperature for 1 hour. After the solution was stirred, the solid obtained by neutralization with hydrochloric acid was collected by suction filtration, thereby obtaining a compound B (3.2 g).

The compound B (1 g) was dissolved in a THF solution consisting of tetrahydrofuran (30 mL, THF), water (10 mL), and hydrochloric acid (1.6 mL), the solution was cooled in an ice bath, sodium nitrite (0.3 g) was added thereto, the resulting solution was stirred for 30 minutes, and amidosulfuric acid (0.5 g) was further added thereto. Separately, phenol (0.4 g) was dissolved in potassium carbonate (2.76 g) and water (50 mL), the solution was cooled in an ice bath, the above-described THF solution was added dropwise thereto, and the resulting solution was stirred at room temperature for 1 hour. After the solution was stirred, water (200 mL) was added, and the obtained compound C (1.7 g) was suction-filtered.

The compound C (0.6 g), the compound X (0.8 g), and potassium carbonate (0.95 g) were dissolved in DMAc (30 mL, dimethylacetamide) and the solution was stirred at 90° C. for 3.5 hours. After the solution was stirred, water (300 mL) was added, the obtained solid was suction-filtered, thereby obtaining a dichroic material D1 (0.3 g).

<Dichroic Materials D2 to D9>

The dichroic materials D2 to D9 described below were synthesized according to the same method as that for the dichroic material D1 or according to a known method.

[Preparation of Polarizer]

A polarizer was prepared as follows. In all polarizers, the polymer liquid crystal compound and the dichroic material were horizontally aligned. The method of evaluating the horizontal alignment is as described above.

Example 1

<Preparation of Alignment Film>

A glass base material (manufactured by Central Glass Co., Ltd., blue plate glass, size of 300 mm×300 mm, thickness of 1.1 mm) was washed with an alkaline detergent, pure water was poured thereinto, and the glass base material was dried.

The dried glass base material was coated with the following composition 1 for forming an alignment film using a #12 bar, and the applied composition 1 for forming an alignment film was dried at 110° C. for 2 minutes to form a coating film on the glass base material.

The obtained coating film was subjected to a rubbing treatment (roller rotation speed: 1000 rotations/spacer thickness of 2.9 mm, stage speed of 1.8 m/min) once to prepare an alignment film 1 on the glass base material.

The coating film was dried at room temperature for 30 seconds and further heated at 150° C. for 15 seconds.

Next, the coating film was cooled to room temperature, heated to 80° C., and cooled to room temperature, thereby preparing a polarizer 1 on the alignment film 1.

Composition of Polarizer-Forming Composition 1
   The following polymer liquid crystal compound L1: 6.493 parts by mass
   The following dichroic material D1: 0.455 parts by mass
   The following interface modifier F1: 0.052 parts by mass
   Chloroform: 93.000 parts by mass

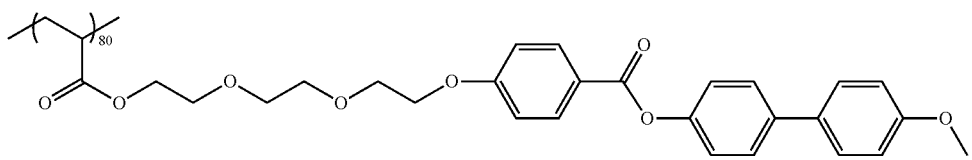

L1

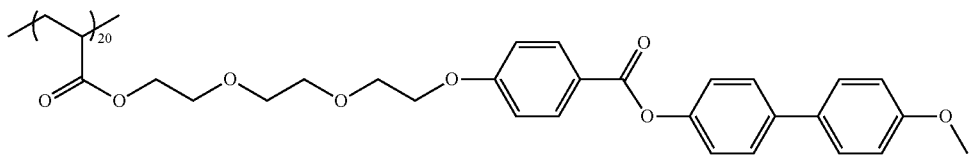

D1

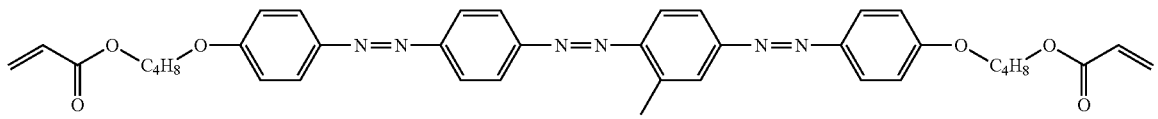

F1

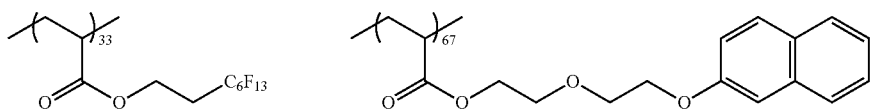

Composition of Composition 1 for Forming Alignment Film
   Modified vinyl alcohol (see Formula (PVA-1)): 2.00 parts by mass
   Water: 74.08 parts by mass
   Methanol 23.86 parts by mass
   Photopolymerization initiator
(IRGACURE 2959, manufactured by BASF SE): 0.06 parts by mass

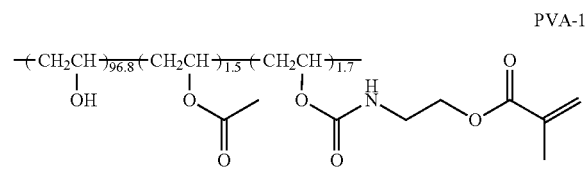

PVA-1

<Preparation of Polarizer>

A piece with a size of 30 mm×30 mm was cut out from the obtained alignment film 1 and spin-coated with the following polarizer-forming composition 1 at 1000 rotations to form a coating film.

Examples 2 to 7 and Comparative Examples 1 to 5

Each polarizer was prepared according to the same procedure as in Example 1 except that the polarizer-forming composition with the composition listed in Table 1 was used in place of the polarizer-forming composition 1.

[Polymer Liquid Crystal Compound]

The polymer liquid crystal compounds used in each example are shown below.

In addition, both L1 and L2 are all thermotropic liquid crystals and are crystalline polymers as described below, and thus correspond to the above-described specific compounds.

Meanwhile, both L3 and L4 are thermotropic liquid crystals, but do not correspond to the specific compound described above because L3 and L4 are not crystalline polymers as described below.

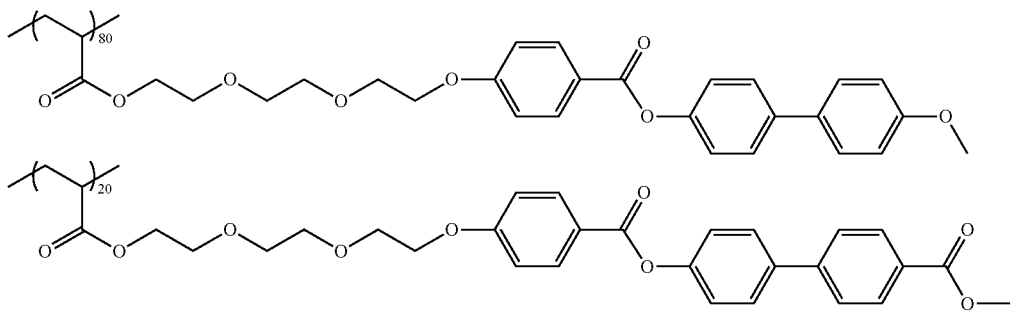
L1
L2
L3
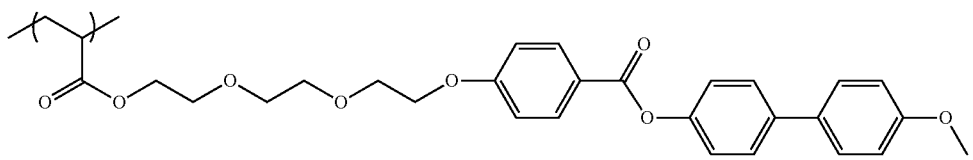
L4
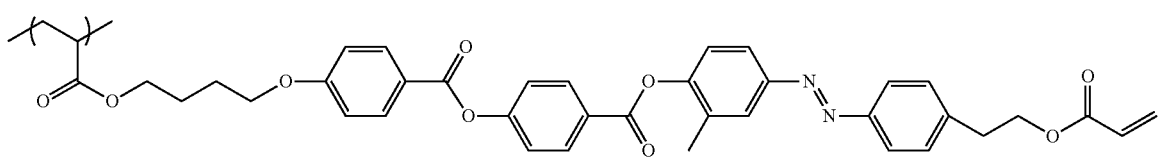
[Dichroic Material]
The dichroic materials used in each example are collectively shown below.
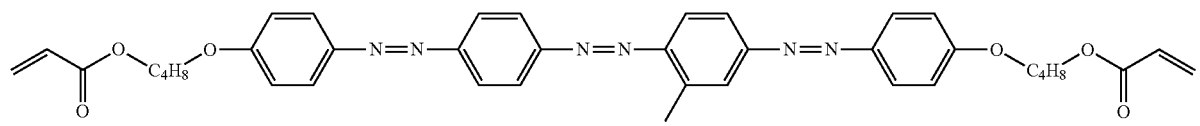
D1
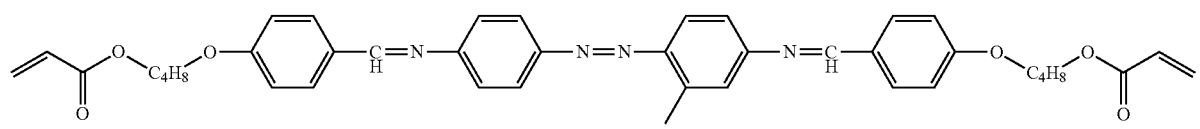
D2
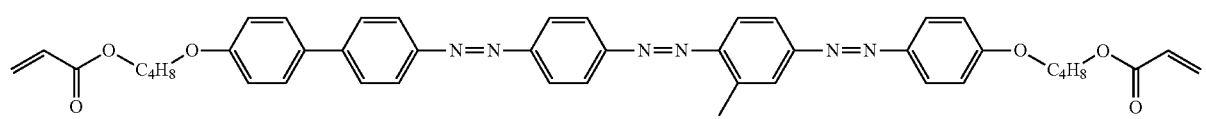
D3
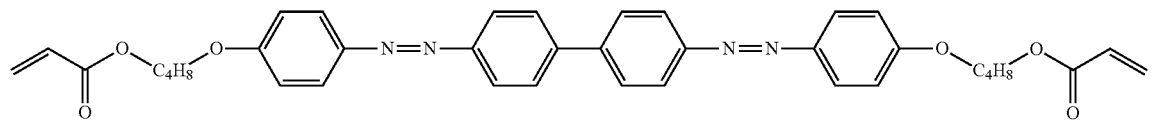
D4

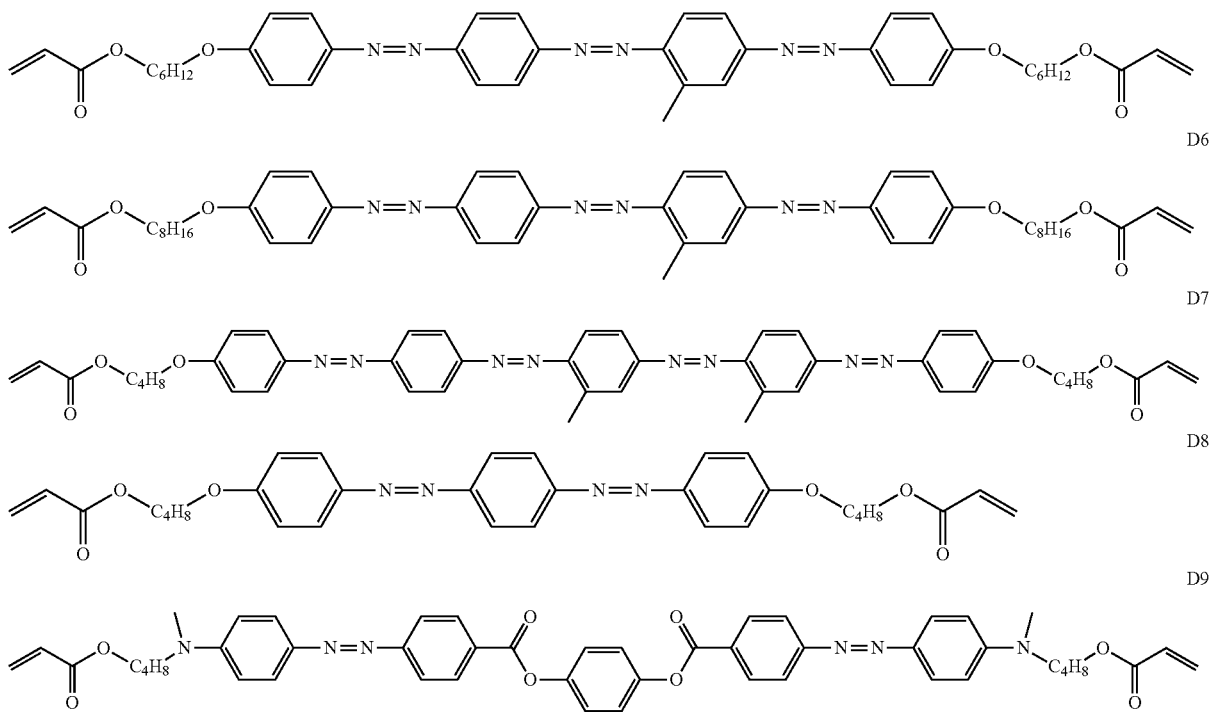

[Evaluation]

As described below, the polymer liquid crystal compounds, the polarizer-forming compositions, and the polarizers were evaluated.

[Presence or Absence of Crystallinity of the Polymer Liquid Crystal Compound]

The presence or absence of crystallinity of the polymer liquid crystal compounds (L1 to L4) was evaluated as follows.

Two polarizers of an optical microscope (ECLIPSE E600 POL, manufactured by Nikon Corporation) were disposed so as to be orthogonal to each other, and a sample table was set between the two polarizers. Further, a small amount of the polymer liquid crystal compound was placed on slide glass, and the slide glass was set on a hot stage placed on the sample table. While the state of the sample was observed, the temperature of the hot stage was increased to a temperature at which the polymer liquid crystal compound exhibited liquid crystallinity, and the polymer liquid crystal compound was allowed to enter a liquid crystal state. After the polymer liquid crystal compound entered the liquid crystal state, the behavior of the liquid crystal phase transition was observed while the temperature of the hot stage was gradually lowered, and the temperature of the liquid crystal phase transition was recorded. In a case where the polymer liquid crystal compound exhibited a plurality of liquid crystal phases (for example, a nematic phase and a smectic phase), all the transition temperatures were also recorded.

Next, approximately 5 mg of a sample of the polymer liquid crystal compound was put into an aluminum pan, and the pan was covered and set on a differential scanning calorimeter (DSC) (an empty aluminum pan was used as a reference). The polymer liquid crystal compound measured in the above-described manner is heated to a temperature at which the compound exhibits a liquid crystal phase, and the temperature is maintained for 1 minute. Thereafter, the calorific value was measured while the temperature was lowered at a rate of 10° C./min. An exothermic peak was confirmed from the obtained calorific value spectrum.

As a result, in L1 and L2, an exothermic peak due to crystallization was observed at a temperature other than the above-described liquid crystal phase transition temperature. That is, it was confirmed that L1 and L2 were crystalline polymers.

Meanwhile, in L3 and R4, exothermic peaks due to crystallization were not observed at a temperature other than the above-described liquid crystal phase transition temperature. That is, it was confirmed that L3 and R4 were not crystalline polymers (non-crystalline polymers).

[Comparison of Crystallinity of Specific Compound in Composition and Crystallinity of Specific Compound Alone]

<XRD Measurement of Polarizer>

First, X-ray diffraction (XRD) measurement was performed on the obtained polarizer. As described above, the crystallinity of the specific compound in the polarizer-forming composition can be evaluated by XRD measurement of the polarizer (film 1).

Specifically, in-plane XRD was performed on the obtained polarizer (with a size of 30 mm×30 mm) by irradiating the surface of the polarizer layer with X-rays under the following conditions using an X-ray diffractometer for evaluating a thin film (trade name: "SmartLab" manufactured by Rigaku Corporation).

Cu ray source (CuKα, output of 45 kV, 200 mA) to be used

X-ray incidence angle of 0.2°

Optical system to be used: parallel optical system (cross beam optics (CBO)) (parallel beam (PB))

Incident side, incident slit: 0.2 mm, incident parallel slit in-plane parallel slit collimator (PSC), 0.5 degrees (deg), longitudinal limit slit: 10 mm Light-receiving side, light-receiving slit: 20 mm, light-receiving parallel slit in-plane parallel slit analyzer (PSA), 0.5 deg $2\theta\chi/\varphi$ Scan, scan conditions: 0.008 degrees/step, 2.0 degrees/min in range of 1 to 40 degrees $\varphi$ Scan, scan condition: 0.5 degree/step, 9.6 degree/min in range of −120 to 120 degrees The direction in which the polymer liquid crystal and the dichroic material were aligned in the major axis direction was set as an azimuthal angle ($\varphi$) of 0°, in-plane measurement ($2\theta\lambda/\varphi$ scan) was performed in all directions for every 15°, and the direction orthogonal to the orientation ($\varphi$) in the substrate plane where the peak intensity became the maximum was set as the direction of the alignment axis based on $\varphi$ scan performed with respect to the observed peak. The measurement was performed using CuKα at an incidence angle of 0.20°. Using the peak in the direction orthogonal to the alignment axis direction, the period length was acquired from the following relationship between the diffraction angle and the distance. The value was standardized as a film thickness corresponding to the X-ray penetration length at an X-ray incidence angle of 0.2°, and the peak intensity was calculated (counter per second (cps) notation).

$d=\lambda/(2\times\sin\theta)$ (d: distance, $\lambda$: incident X-ray wavelength (CuKα; 1.54λ))

In the polarizers of Examples 1 to 7 and Comparative Examples 1 to 3, the peaks a were observed at positions where 2θ was 2.8° (period length: 31.6 Å), 4.9° (period length: 18.1 Å), and 7.9° (period length: 11.6 Å), and the broad peak b (halo) was observed at a position where 2θ was approximately 18 to 22° (period length: 4 to 5 Å), in the direction where $\varphi$ was 90°.

Here, since all the half-widths of the peaks a are less than 2°, all the peaks a correspond to the above-described peak A. Since the half-width of the peak b is 2° or greater, the peak b corresponds to the above-described peak B.

Meanwhile, in the polarizers of Comparative Examples 4 and 5, the peak b was observed, but the peak a was not observed.

In the polarizer of Example 1, the intensities of the peaks a were respectively 2700, 2200, and 1790 from the lower angle side.

The peak intensities of the peaks at positions where 2θ was approximately 2.8° (peak intensities) in the polarizers of Examples 1 to 7 and Comparative Examples 1 to 3 are listed in Table 1.

Further, a difference between the baseline intensity and the peak top intensity was defined as the peak intensity.

<XRD Measurement of Coating Film of Specific Compound Alone>

Next, XRD measurement was performed on the film (film 2) of the specific compound alone. As described above, the crystallinity of the specific compound alone can be evaluated by the XRD measurement of the film of the specific compound alone.

(Coating Film 8: Polymer Liquid Crystal Compound L1)

Specifically, a coating film 8 (film 2) was prepared according to the same procedures as those for the preparation of the polarizer 1 in Example 1 except that the composition 8 was used in place of the polarizer-forming composition 1.

Composition of Composition 8
 Polymer liquid crystal compound L1 shown below: 6.948 parts by mass
 The following interface modifier FL: 0.052 parts by mass
 Chloroform: 93.000 parts by mass The XRD measurement was performed on the coating film 8 in the same manner as that for the above-described polarizer.

As a result, similarly to the polarizers of Examples 1 to 7 and Comparative Examples 1 to 3, the peaks a were observed at positions where 2θ was 2.8°, 4.9°, and 7.9° in a direction of 0°, and broad peaks b (halo) were observed at positions where 2θ was approximately 19° to 20°.

(Coating Film 9: Polymer Liquid Crystal Compound L2)

Further, a coating film 9 (film 2) was prepared according to the same procedures as those for the preparation of the polarizer 1 in Example 1 except that the composition 9 was used in place of the polarizer-forming composition 1.

Composition of Composition 9
 Polymer liquid crystal compound L2 shown below: 6.948 parts by mass
 The following interface modifier F1: 0.052 parts by mass
 Chloroform: 93.000 parts by mass The XRD measurement was performed on the coating film 9 in the same manner as that for the above-described polarizer.

As a result, the peaks were not observed at positions where 2θ was 2.8° and 4.9° in a direction of 0°, the peaks a were observed at positions where 2θ was 7.9°, and broad peaks b (halo) were observed at positions where 2θ was approximately 19° to 20°.

<Comparison of XRD Spectra>

(Embodiment in which Polymer Liquid Crystal Compound L1 was Used)

The XRD spectrum of Example 1 was compared with the XRD spectrum of coating film 8.

As a result, it was confirmed that the peak intensity ratio of the peak intensity of the peak a of Example 1 to the peak intensity of the peak a of the coating film 8 was 2.5 times, 4.2 times, and 1.6 times from the low angle side (the above-described condition (i) was satisfied), and the crystallinity of the polymer liquid crystal compound L1 in the polarizer-forming composition used in Example 1 was higher than the crystallinity of the polymer liquid crystal compound L1 alone.

Similarly, based on the comparison of the XRD spectra of Examples 2 to 6 and Comparative Examples 1 to 3, it was confirmed that the peak intensity ratio of any peak was higher than 1 (the above-described condition (i) was satisfied) and the crystallinity of the polymer liquid crystal compound L1 in the polarizer-forming composition used in Examples 2 to 6 was higher crystallinity of the polymer liquid crystal compound L1 alone.

Meanwhile, in Comparative Examples 1 to 3, it was confirmed that the peak intensity ratio was 1.0 or less in any of the peaks (the above-described condition (i) was not satisfied), a new peak A which was not observed in the coating film 8 was not observed (the above-described condition (ii) was not satisfied), and the crystallinity of the polymer liquid crystal compound L1 in the polarizer-forming compositions used in Comparative Examples 1 to 3 was less than or equal to the crystallinity of the polymer liquid crystal compound L1 alone.

The peak intensity ratios of the peaks at positions where 2θ was approximately 7.9° (peak intensity ratios) of Examples 1 to 6 and Comparative Examples 1 to 3 are listed in Table 1.

(Embodiment in which Polymer Liquid Crystal Compound L2 was Used)

The XRD spectrum of Example 7 was compared with the XRD spectrum of coating film 9.

As described above, while peaks a were observed only at positions where 2θ was 7.9° in the coating film 9, the peaks a were observed at positions where 2θ was 2.8°, 4.9°, and 7.9° in Example 7.

Based on the result, it was confirmed that since the above-described condition (ii) was satisfied, the crystallinity of the polymer liquid crystal compound L2 in the polarizer-forming composition used in Example 7 was higher than that of the polymer liquid crystal compound L2 alone.

[Degree of Alignment]

Each polarizer of the examples and the comparative examples was set on a sample table in a state where a linear polarizer was inserted into the light source side of an optical microscope (product name "ECLIPSE E600 POL", manufactured by Nikon Corporation), and the absorbance of the polarizer in a wavelength range listed in Table 1 was measured using a multichannel spectrometer (product name "QE65000" manufactured by Ocean Optics, Inc.). Next, the degree of alignment was calculated according to the following equation. The results are listed in Table 1. Practically, the degree of alignment is preferably 0.93 or greater.

Degree of alignment: $S=((Az0/Ay0)-1)/((Az0/Ay0)+2)$

Az0: Absorbance of polarizer with respect to polarized light in absorption axis direction Ay0: Absorbance of polarizer with respect to polarized light in polarization axis direction

TABLE 1

| | Polymer liquid crystal compound | | | Dichroic material | | | Interface modifier | | Chloroform | Length of planar structure [Å] | |
|---|---|---|---|---|---|---|---|---|---|---|---|
| | Type | Part by mass | logP | Type | Part by mass | logP | Type | Part by mass | Part by mass | Polymer liquid crystal compound | Dichroic material |
| Example 1 | L1 | 6.493 | 4.6 | D1 | 0.455 | 9.4 | F1 | 0.052 | 93.000 | 11.6 | 23.3 |
| Example 2 | L1 | 6.493 | 4.6 | D2 | 0.455 | 9.7 | F1 | 0.052 | 93.000 | 11.6 | 23.6 |
| Example 3 | L1 | 6.493 | 4.6 | D3 | 0.455 | 10.8 | F1 | 0.052 | 93.000 | 11.6 | 27.7 |
| Example 4 | L1 | 6.493 | 4.6 | D4 | 0.455 | 9.5 | F1 | 0.052 | 93.000 | 11.6 | 21.7 |
| Example 5 | L1 | 6.493 | 4.6 | D5 | 0.455 | 10.7 | F1 | 0.052 | 93.000 | 11.6 | 23.3 |
| Example 6 | L1 | 6.493 | 4.6 | D6 | 0.455 | 12.4 | F1 | 0.052 | 93.000 | 11.6 | 23.3 |
| Example 7 | L2 | 6.097 | 4.6 | D1 | 0.854 | 9.4 | F1 | 0.049 | 93.000 | 11.6 | 23.3 |
| Comparative Example 1 | L1 | 6.493 | 4.6 | D7 | 0.455 | 10.6 | F1 | 0.052 | 93.000 | 11.6 | 29.4 |
| Comparative Example 2 | L1 | 6.493 | 4.6 | D8 | 0.455 | 8.0 | F1 | 0.052 | 93.000 | 11.6 | 17.5 |
| Comparative Example 3 | L1 | 6.493 | 4.6 | D9 | 0.455 | 8.5 | F1 | 0.052 | 93.000 | 11.6 | 12.9 |
| Comparative Example 4 | L3 | 6.493 | 8.4 | D1 | 0.455 | 9.4 | F1 | 0.052 | 93.000 | 11.6 | 23.3 |
| Comparative Example 5 | L4 | 6.493 | 8.2 | D1 | 0.455 | 9.4 | F1 | 0.052 | 93.000 | 11.6 | 23.3 |

| | Length of planar structure [Å] | | XRD | | | | |
|---|---|---|---|---|---|---|---|
| | Difference | Ratio R | Peak intensity [cps] | Comparison | Peak intensity ratio | ΔlogP | Degree of alignment |
| Example 1 | 0.10 | 1.004 | 1790 | (i) | 1.6 | 4.8 | 0.96 |
| Example 2 | 0.40 | 1.017 | 1750 | (i) | 1.6 | 5.1 | 0.96 |
| Example 3 | 4.50 | 1.194 | 1670 | (i) | 1.5 | 6.2 | 0.93 |
| Example 4 | −1.50 | 0.935 | 1670 | (i) | 1.5 | 4.9 | 0.94 |
| Example 5 | 0.10 | 1.004 | 1730 | (i) | 1.5 | 6.1 | 0.95 |
| Example 6 | 0.10 | 1.004 | 1630 | (i) | 1.5 | 7.8 | 0.94 |
| Example 7 | 0.10 | 1.004 | 1540 | (ii) | — | 4.8 | 0.95 |
| Comparative Example 1 | 6.20 | 1.267 | 1170 | — | 1.0 | 6.0 | 0.92 |
| Comparative Example 2 | −5.70 | 0.754 | 1170 | — | 1.0 | 3.4 | 0.92 |
| Comparative Example 3 | −10.30 | 0.556 | 1130 | — | 1.0 | 3.9 | 0.90 |
| Comparative Example 4 | 0.10 | 1.004 | — | — | — | 1.0 | 0.85 |
| Comparative Example 5 | 0.10 | 1.004 | — | — | — | 1.2 | 0.84 |

In Table 1, the columns of the length of the planar structure (polymer liquid crystal compound) show the length p (Å) of the planar structure of the polymer liquid crystal compound, and the columns of the length of the planar structure (dichroic material) show the length q (Å) of the planar structure of the dichroic material. The method of calculating the length of the planar structure is as described above.

In Table 1, the columns of the length (difference) of the planar structure show values obtained by subtracting twice the length p from the length q.

In Table 1, the columns of the length (ratio R) of the planar structure show values of "(iii) q/2p" in the ratio R described above.

In Table 1, the columns of XRD (comparison) show the results of the comparison of the XRD spectrum described above. Specifically, (i) indicates that the above-described condition (i) is satisfied, and (ii) indicates that the above-described condition (ii) is satisfied.

In Table 1, the columns of Δ log P show Δ log P described above (the absolute value of the difference between the log P value of the polymer liquid crystal compound and the log P value of the dichroic material). The method of calculating the log P value is as described above.

As can be seen from Table 1, in Examples 1 to 7 in which the specific compound serving as a crystalline polymer was used as the polymer liquid crystal compound, and the crystallinity of the specific compound in the polarizer-forming composition was higher than the crystallinity of the specific compound alone, the degree of alignment was high.

In particular, in Examples 1 to 2 and 4 to 7 in which the specific compound had the planar structure P, the dichroic material had the planar structure Q, and the above-described ratio R (q/2p) was 1.15 or less, the degree of alignment was higher.

Among these, in Examples 1 to 2, 5, and 7 in which the above-described ratio R (q/2p) was 0.95 or greater and Δ log P was 7.0 or less, the degree of alignment was even higher.

Among these, in Examples 1 and 2 in which the specific compound had a repeating unit A in which T1 represents an alkoxy group and a repeating unit B in which T1 represents a group other than an alkoxy group, and Δ log P was 6.0 or less, the degree of alignment was particularly higher.

Meanwhile, in Comparative Examples 4 and 5 in which a non-crystalline polymer was used as the polymer liquid crystal compound, the degree of alignment was insufficient. Further, in Comparative Examples 1 to 3 in which the specific compound was used as the polymer liquid crystal compound, but the crystallinity of the specific compound in the polarizer-forming composition was less than or equal to the crystallinity of the specific compound alone, the alignment degree was higher as compared with Comparative Examples 4 and 5 in which a non-crystalline polymer was used as the polymer liquid crystal compound, but the alignment degree was still insufficient.

[Influence of Crystallinity on Vertical Alignment]

In the polarizer in which the polymer liquid crystal compound and the dichroic material were vertically aligned, the influence of the crystallinity of the polymer liquid crystal compound on the degree of alignment was examined.

Reference Example 1

The alignment film was spin-coated with the following polarizer-forming composition X1 at a speed of 1000 rotations to form a coating film. After the coating film was dried at room temperature for 30 seconds, the coating film was heated to 140° C., maintained for 30 seconds, and cooled to room temperature. Next, the coating film was reheated to 80° C., maintained for 30 seconds, and then cooled to room temperature, thereby preparing a polarizer X1 on the alignment film.

In the polarizer X1, it was confirmed that the polymer liquid crystal compound and the dichroic material were not horizontally aligned (vertically aligned). The method of evaluating the vertical alignment is the same as that for the above-described horizontal alignment.

Composition of Polarizer-Forming Composition X1

Polymer liquid crystal compound L1 shown above: 4.011 parts by mass
Dichroic material D1 shown above: 0.792 parts by mass
Dichroic material D10 shown below: 0.963 parts by mass
Interface modifier F2 shown below: 0.087 parts by mass
Interface modifier F3 shown below: 0.073 parts by mass
Interface modifier F4 shown below: 0.073 parts by mass
Tetrahydrofuran: 79.901 parts by mass
Cyclopentanone: 14.100 parts by mass
Dichroic material D10

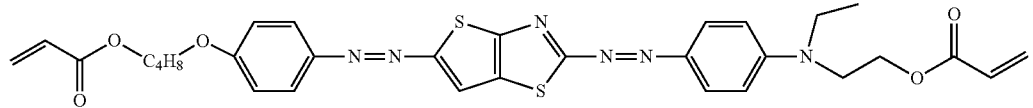

F2

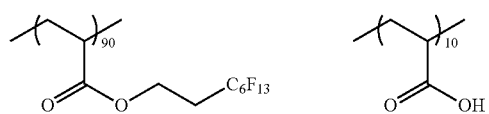

F3

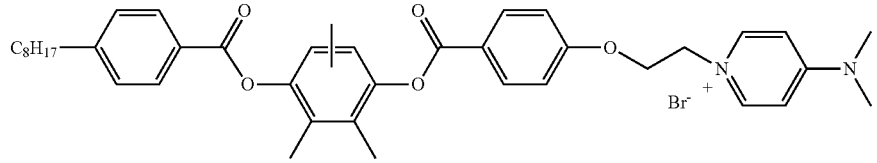

F4

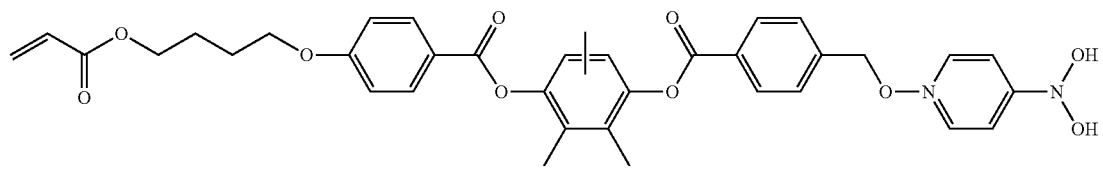

The Mueller matrix of the polarizer X1 at a wavelength λ was calculated based on the polar angle measured for every 10° from −50° to 50° using AxoScan OPMF-1 (manufactured by Opto science, Inc.). The extinction coefficient ko [λ] (in-plane direction) and the extinction coefficient ke [λ] (thickness direction) were calculated by removing the influence of the surface reflection and fitting the result to the following theoretical formula in consideration of the Snell's formula and Fresnel's equations. Unless otherwise specified, the wavelength λ is 550 nm.

$$k=-\log(T)\times\lambda/(4\pi d)$$

Here, T represents the transmittance, and d represents the thickness of the polarizer.

Based on the calculated ko [λ] and ke [i], the absorbance and the dichroic ratio in the in-plane direction and thickness direction were calculated, and the degree of vertical alignment was finally acquired. As a result, the degree of vertical alignment was 0.92.

Reference Example 2

A polarizer X2 was prepared according to the same procedures as in Reference Example 1 except that the following polarizer-forming composition X2 was used in place of the polarizer-forming composition X1.

In the polarizer X2, it was confirmed that the polymer liquid crystal compound and the dichroic material were not horizontally aligned (vertically aligned). The method of evaluating the vertical alignment is the same as that for the above-described horizontal alignment.

As a result of evaluation of the degree of vertical alignment in the same manner as in Reference Example 1, the degree of vertical alignment was 0.92.

Composition of Polarizer-Forming Composition X2

- Polymer liquid crystal compound L3 shown above: 4.001 parts by mass
- Dichroic material D1 shown above: 0.875 parts by mass
- Dichroic material D10 shown above: 1.125 parts by mass
- Interface modifier F2 shown above: 0.087 parts by mass
- Interface modifier F3 shown above: 0.073 parts by mass
- Interface modifier F4 shown above: 0.073 parts by mass
- Tetrahydrofuran: 79.701 parts by mass
- Cyclopentanone: 14.065 parts by mass Based on the evaluation results of the degree of vertical alignment in Reference Examples 1 and 2, the degree of vertical alignment in Reference Example 1 in which the polymer liquid crystal compound was crystalline was the same as in Reference Example 2 in which the polymer liquid crystal compound was amorphous. That is, it was confirmed that in a case where the polymer liquid crystal compound and the dichroic material were vertically aligned, the crystallinity of the polymer liquid crystal compound did not affect the degree of alignment.

Meanwhile, as described above, in a case where the polymer liquid crystal compound and the dichroic material are horizontally aligned, the degree of alignment is greatly improved by using a crystalline polymer as the polymer liquid crystal compound.

Based on this result, the effect that the degree of alignment is greatly improved in a case where a crystalline polymer is used as the polymer liquid crystal compound is a special effect obtained in a case where the polymer liquid crystal compound and the dichroic material are horizontally aligned.

What is claimed is:

1. A polarizer which is formed of a polarizer-forming composition containing a polymer liquid crystal compound and a dichroic material,
   wherein the polymer liquid crystal compound is a thermotropic liquid crystal and a crystalline polymer,
   the polymer liquid crystal compound and the dichroic material are horizontally aligned, and
   a crystallinity of the polymer liquid crystal compound in the polarizer-forming composition is higher than a crystallinity of the polymer liquid crystal compound alone.

2. The polarizer according to claim 1,
   wherein the polymer liquid crystal compound has a planar structure P and the dichroic material has a planar structure Q, and
   a ratio R of a length q of the planar structure Q to a length p of the planar structure P is in a range of 0.91 to 1.50, where the ratio R represents any of the following (i) to (iii),
   (i) q/p
   (ii) 2q/p
   (iii) q/2p
   in (i) to (iii), p represents the length p, and q represents the length q.

3. The polarizer according to claim 2,
   wherein the ratio R is 1.15 or less.

4. The polarizer according to claim 2,
   wherein the ratio R is 0.95 or greater.

5. The polarizer according to claim 1,
   wherein a difference between a log P value of the polymer liquid crystal compound and a log P value of the dichroic material is 7.0 or less.

6. The polarizer according to claim 5,
   wherein the difference between a log P value of the polymer liquid crystal compound and a log P value of the dichroic material is 6.0 or less.

7. The polarizer according to claim 1,
   wherein the polymer liquid crystal compound has a repeating unit represented by Formula (1),

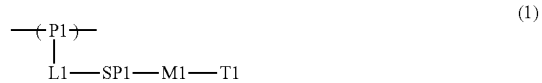

in Formula (1), P1 represents a main chain of the repeating unit, L1 represents a single bond or a divalent linking group, SP1 represents a spacer group, M1 represents a mesogen group, and T1 represents a terminal group.

8. The polarizer according to claim 7,
   wherein the mesogen group represented by M1 in Formula (1) has three aromatic hydrocarbon groups.

9. The polarizer according to claim 7,
wherein the spacer group represented by SP1 in Formula (1) is a group represented by *—(CH$_2$—CH$_2$O)$_3$—*, where a symbol * represents a bonding position with respect to L1 or M1 in Formula (1).

10. The polarizer according to claim 7,
wherein the terminal group represented by T1 in Formula (1) is a methoxy group.

11. The polarizer according to claim 7,
wherein the polymer liquid crystal compound has two kinds of repeating units represented by Formula (1),
in one repeating unit, T1 in Formula (1) represents an alkoxy group, and
in the other repeating unit, T1 in Formula (1) represents a group other than the alkoxy group.

12. An image display device comprising:
the polarizer according to claim 1.

13. The polarizer according to claim 3,
wherein the ratio R is 0.95 or greater.

14. The polarizer according to claim 2,
wherein a difference between a log P value of the polymer liquid crystal compound and a log P value of the dichroic material is 7.0 or less.

15. The polarizer according to claim 14,
wherein the difference between a log P value of the polymer liquid crystal compound and a log P value of the dichroic material is 6.0 or less.

16. The polarizer according to claim 2,
wherein the polymer liquid crystal compound has a repeating unit represented by Formula (1),

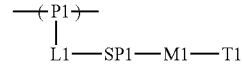

(1)

in Formula (1), P1 represents a main chain of the repeating unit, L1 represents a single bond or a divalent linking group, SP1 represents a spacer group, M1 represents a mesogen group, and T1 represents a terminal group.

17. The polarizer according to claim 16,
wherein the mesogen group represented by M1 in Formula (1) has three aromatic hydrocarbon groups.

18. The polarizer according to claim 16,
wherein the spacer group represented by SP1 in Formula (1) is a group represented by *—(CH$_2$—CH$_2$O)$_3$—*, where a symbol * represents a bonding position with respect to L1 or M1 in Formula (1).

19. The polarizer according to claim 16,
wherein the terminal group represented by T1 in Formula (1) is a methoxy group.

20. An image display device comprising:
the polarizer according to claim 2.

* * * * *